United States Patent
Mitani et al.

(10) Patent No.: US 7,230,852 B2
(45) Date of Patent: Jun. 12, 2007

(54) NON-VOLATILE SEMICONDUCTOR MEMORY DEVICE ALLOWING EFFICIENT PROGRAMMING OPERATION AND ERASING OPERATION IN SHORT PERIOD OF TIME

(75) Inventors: Hidenori Mitani, Hyogo (JP); Fumihiko Nitta, Hyogo (JP); Tadaaki Yamauchi, Hyogo (JP); Taku Ogura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 161 days.

(21) Appl. No.: 10/940,812

(22) Filed: Sep. 15, 2004

(65) Prior Publication Data

US 2005/0057997 A1   Mar. 17, 2005

(30) Foreign Application Priority Data

Sep. 16, 2003   (JP)   ............................. 2003-322643

(51) Int. Cl.
*G11C 11/34*   (2006.01)
*G11C 16/34*   (2006.01)

(52) U.S. Cl. ........................... 365/185.18; 365/185.19; 365/185.29; 365/185.3; 365/185.33

(58) Field of Classification Search ........... 365/185.18, 365/185.19, 185.29, 185.3, 185.33
See application file for complete search history.

(56) References Cited

U.S. PATENT DOCUMENTS

| | | | | |
|---|---|---|---|---|
| 5,914,896 A | * | 6/1999 | Lee et al. | 365/185.19 |
| 5,991,201 A | * | 11/1999 | Kuo et al. | 365/185.19 |
| 6,118,704 A | * | 9/2000 | Hirata | 365/185.29 |
| 6,330,192 B1 | * | 12/2001 | Ohba et al. | 365/185.3 |
| 6,442,075 B2 | * | 8/2002 | Hirano | 365/185.29 |
| 6,724,662 B2 | * | 4/2004 | Manea | 365/185.3 |
| 6,781,882 B2 | * | 8/2004 | Shimizu et al. | 365/185.18 |
| 6,831,864 B2 | * | 12/2004 | Mizoguchi et al. | 365/185.29 |
| 6,914,827 B2 | * | 7/2005 | Choi | 365/185.29 |
| 6,934,187 B2 | * | 8/2005 | Cheung | 365/185.18 |

FOREIGN PATENT DOCUMENTS

JP   11-191296   7/1999

* cited by examiner

*Primary Examiner*—Trong Phan
(74) *Attorney, Agent, or Firm*—McDermott Will & Emery LLP

(57) ABSTRACT

Until the number of pulse application n reaches 12, as a first-half pulse, a pulse is set to have a width fixed to 2 ms, and its voltage is increased every time. As a latter-half pulse, the pulse is set to have a width fixed to 3 ms and the pulse voltage is increased every time until the maximum voltage is attained. After the maximum voltage is attained, first, the pulse of a width of 3 ms is applied twice, the pulse of a width of 4 ms with the maximum voltage is applied twice, and the pulse of a width of 5 ms with the maximum voltage is applied twice. Even after the maximum voltage is attained, change over time of a threshold voltage can be more linear. Thus, a non-volatile semiconductor memory device allowing efficient programming operation and erasing operation in a short period of time can be provided.

9 Claims, 34 Drawing Sheets

| VARIABLE | INDICATION | EXAMPLE |
|---|---|---|
| X | THE NUMBER OF TIMES OF PULSE APPLICATION | 13 (TIMES) |
| $\Delta V1$ | PULSE VOLTAGE INCREMENT | 0.1, 0.1, 0.2···(V) |
| $\Delta V2$ | PULSE VOLTAGE INCREMENT | 0.2, 0.3, 0.5···(V) |
| A | PULSE WIDTH | 2 (ms) |
| B | PULSE WIDTH | 3 (ms) |
| K | THE NUMBER OF TIMES OF CONTINUOUS PULSE APPLICATION | 2 (TIMES) |
| $\Delta t$ | PULSE WIDTH INCREMENT | 1, 1, 1···(ms) |

NON-VOLATILE SEMICONDUCTOR MEMORY DEVICE ALLOWING EFFICIENT PROGRAMMING OPERATION AND ERASING OPERATION IN SHORT PERIOD OF TIME

BACKGROUND OF THE INVENTION

1. Field of the Invention

The present invention relates to a non-volatile semiconductor memory device, and more particularly to a flash memory of which contents in a memory block can collectively be erased.

2. Description of the Background Art

Recently, a non-volatile semiconductor memory device, in particular a flash memory, has increasingly been mounted on a battery-driven, portable instrument, and a more efficient writing or erasing method has been demanded.

For example, Japanese Patent Laying-Open No. 11-191296 discloses a technique directed to a controlled method of writing hot electrons for a non-volatile memory cell, aiming at optimization of writing to a cell. In other words, particularly with regard to soft writing after programming and erasing, a cell substrate is biased to a negative voltage with respect to a source region, and a control gate region of the cell receives a ramp voltage having a selected, predetermined gradient satisfying a balance condition.

In order to realize a quick and smooth operation or a long-lasting operation of a portable terminal, a further efficient internal operation sequence in a flash memory such as a programming operation or an erasing operation should be attained.

SUMMARY OF THE INVENTION

An object of the present invention is to provide a non-volatile semiconductor memory device allowing efficient programming and erasing operation in a short period of time.

In summary, a non-volatile semiconductor memory device according to the present invention includes: a memory block including a plurality of memory cells storing data in a non-volatile manner; a power supply circuit generating a voltage to be applied to the plurality of memory cells; and a control portion controlling the power supply circuit so as to apply an erasing pulse collectively to the plurality of memory cells in the memory block. In repeated application of the erasing pulse, the control portion increases a voltage of the erasing pulse of a first fixed pulse width in accordance with the number of times of application until the voltage of the erasing pulse attains a maximum application voltage value, and when the voltage of the erasing pulse attains the maximum application voltage value, the control portion increases the pulse width of the erasing pulse in accordance with the number of times of application.

According to another aspect of the present invention, a non-volatile semiconductor memory device includes: a memory block including a plurality of memory cells storing data in a non-volatile manner; a power supply circuit generating a voltage to be applied to the plurality of memory cells; and a decode circuit decoding an address signal in order to select a portion of the plurality of memory cells. The decode circuit performs a first operation to select the portion in accordance with the address signal and a second operation to select another region in addition to that portion in accordance with the address signal, by switching between the two operations in accordance with a control signal. The non-volatile semiconductor memory device further includes a control portion controlling the power supply circuit and the decode circuit so as to erase contents in the memory block. The control portion causes the decode circuit to perform the second operation by the control signal after the memory block enters a first erased state, so as to apply an overerase recovery pulse to the memory block.

According to yet another aspect of the present invention, a non-volatile semiconductor memory device includes: a memory block including a plurality of memory transistors storing data in a non-volatile manner; a power supply circuit generating a gate voltage to be applied to a control gate of the plurality of transistors and a drain voltage to be applied to a drain thereof; a counter counting up a count value corresponding to a target voltage value of the gate voltage in response to a clock signal; and a control portion controlling the power supply circuit. The control portion instructs activation of the drain voltage to the power supply circuit, and thereafter sets an initial value for the count value in the counter, so as to control start and stop of a count-up operation of the counter.

According to yet another aspect of the present invention, a non-volatile semiconductor memory device having a normal writing mode and an accelerated writing mode includes: a memory block including a plurality of memory cells storing data in a non-volatile manner; a buffer storage having write data initially set in writing and temporarily holding data; and a verify circuit outputting information for applying a writing pulse to the memory block upon receiving read data from the memory block and a value held in the buffer storage. The verify circuit performs a first operation to compare the value held in the buffer storage with the read data for update of the value held in the buffer storage so as to output the information and a second operation to output the value held in the buffer storage as it is as the information. The non-volatile semiconductor memory device further includes a control portion controlling the verify circuit. The control portion causes output of the information for a first writing pulse by causing the verify circuit to perform the first operation in the normal writing mode, and causes output of the information for the first writing pulse by causing the verify circuit to perform the second operation in the accelerated writing mode.

According to yet another aspect of the present invention, a non-volatile semiconductor memory device includes: a memory block including a plurality of memory transistors storing data in a non-volatile manner; a power supply circuit generating a voltage to be applied to the plurality of memory transistors; a counter counting up a count value corresponding to a target voltage value of the voltage in response to a clock signal; and a control portion controlling the power supply circuit. When collective erasing of the contents in the memory block is instructed, the control portion sets an initial value for the count value in the counter so as to control start and stop of a count-up operation of the counter.

According to yet another aspect of the present invention, a non-volatile semiconductor memory device includes: a normal memory cell array; a spare memory cell array; a normal decode circuit selecting a portion of the normal memory cell array in accordance with an address signal; a redundancy determination circuit performing redundancy determination upon receiving the address signal; a gate circuit forcibly activating an output from the redundancy determination circuit in response to a test signal; and a spare decode circuit selecting a portion of the spare memory cell array in accordance with an output from the gate circuit and the address signal. The spare decode circuit selects a specific portion of the spare memory cell array once in a plurality of times when the address signal is incremented at activation of the test signal.

According to the present invention, even after the pulse voltage attains the maximum voltage, change of the threshold voltage can be more linear.

Therefore, a time period for erasing the contents in a block (hereinafter, referred to as block erasing) can be shortened, and a non-volatile semiconductor memory device allowing an efficient operation, of which contents can be erased with high speed, can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
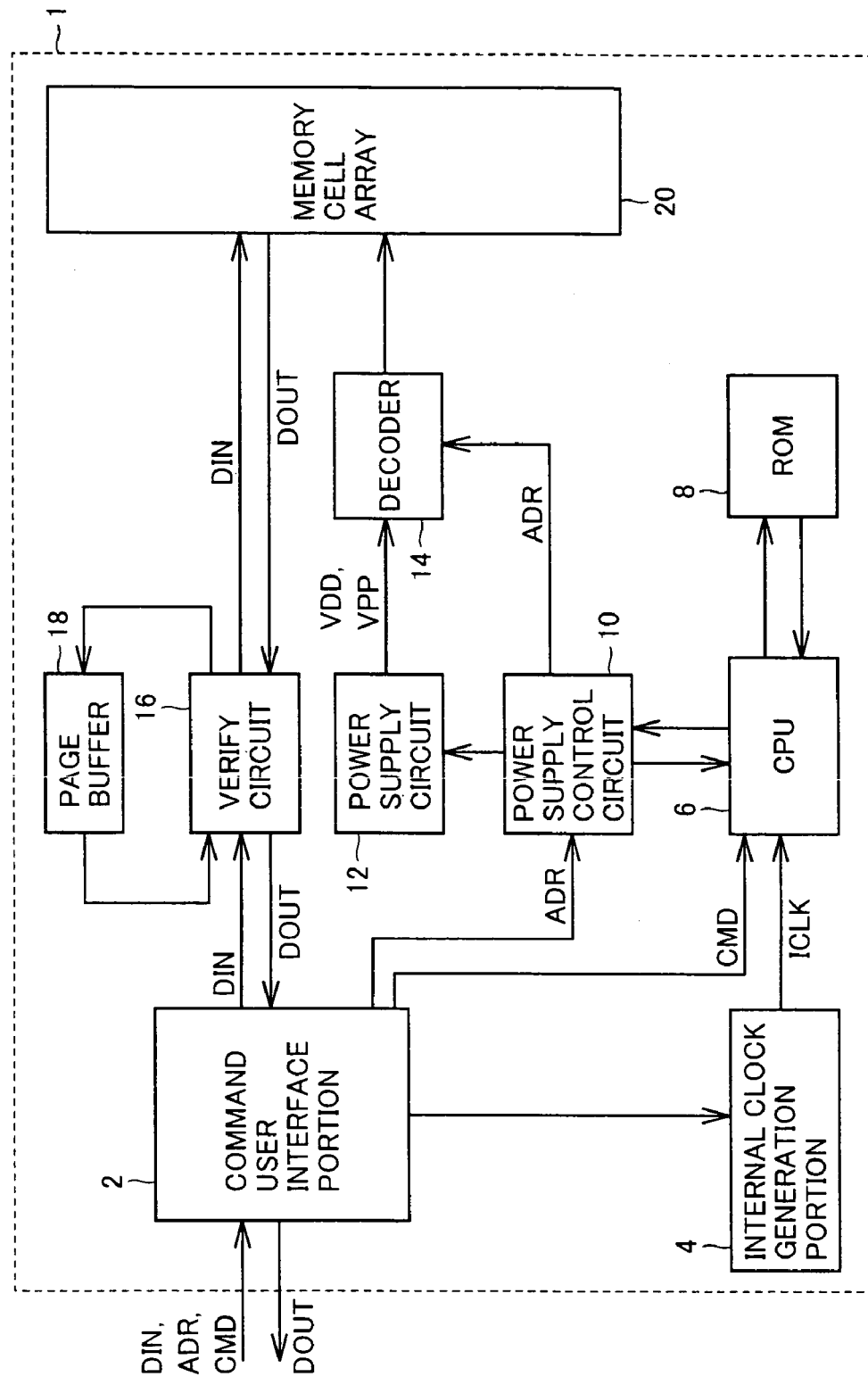
FIG. 1 is a block diagram showing a configuration of a non-volatile semiconductor memory device 1 according to the present invention.

In the following, embodiments of the present invention will be described in detail with reference to the figures. It is noted that the same reference characters refer to the same or corresponding components in the figures.

Embodiment 1

FIG. 1 is a block diagram of a configuration of a non-volatile semiconductor memory device 1 according to the present invention.

Referring to FIG. 1, non-volatile semiconductor memory device 1 includes a command user interface portion 2 receiving a data signal DIN and outputting a data signal DOUT, an address signal ADR and a command signal CMD that are externally provided and distributing those signals, to an internal block; an internal clock generation portion 4 generating an internal clock ICLK in accordance with an instruction from command user interface portion 2; a CPU (central processing unit) 6 receiving command signal CMD and internal clock signal ICLK from command user interface portion 2 and internal clock generation portion 4 respectively and serving for overall control of non-volatile semiconductor memory device 1; and a read-only memory (ROM) 8 communicating data with CPU 6.

Non-volatile semiconductor memory device 1 further includes a power supply circuit 12 outputting voltage VDD and VPP, a power supply control circuit 10 controlling power supply circuit 12 in accordance with an instruction from CPU 6, and a decoder 14 distributing a negative voltage or a high voltage VPP generated in power supply circuit 12 in accordance with address signal ADR provided through power supply control circuit 10.

Non-volatile semiconductor memory device 1 further includes a page buffer 18, a verify circuit 16, and a memory cell array 20.

In erasing, verify circuit 16 reads data in the memory cell array after the erasing pulse is applied to the memory cell array, so as to confirm whether or not erasing has been completed. In writing, verify circuit 16 compares externally provided data signal DIN with a result of reading of the data held in the memory cell array, so as to determine whether or not a programming pulse should be applied.

Page buffer 18 serves as a buffer storage, and temporarily stores the data. In writing, write data is initially set in page buffer 18 through verify circuit 16, and thereafter, a result of comparison by verify circuit 16 is written in the same.

Memory cell array 20 includes a plurality of memory blocks. CPU 6 controls power supply circuit 12 by sending a control signal to power supply control circuit 10, in response to a command by software recorded in ROM 8. More specifically, power supply control circuit 10 sets a target voltage value for a not-shown charge pump circuit provided within power supply circuit 12, and the charge pump circuit generates a voltage in accordance with the target voltage value. Finally, the voltage generated in such a manner is applied to the whole memory blocks in the memory cell array, so as to cause FN (Fowler-Nordheim) tunneling phenomenon. Such voltage application is referred to as application of the erasing pulse.

Figures 2, 3:
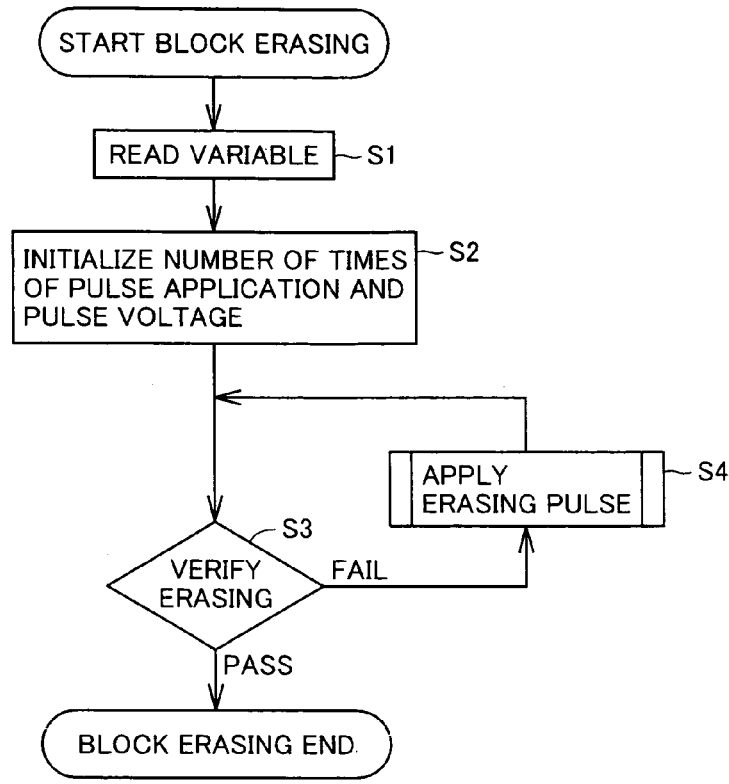
FIG. 2 is a flowchart illustrating control of block erasing in non-volatile semiconductor memory device 1 according to the present invention.
FIG. 3 shows variables read in step S1 in FIG. 2.

FIG. 2 is a flowchart illustrating control of block erasing in non-volatile semiconductor memory device 1 according to the present invention.

Referring to FIG. 2, when a prescribed erasing command is input and a block erasing operation is started, first, a variable is read in step S1.

FIG. 3 shows variables read in step S1 in FIG. 2.

Referring to FIG. 3, a variable X represents the number of times of pulse application, and it is set to 13 times, for example. A variable $\Delta 1$ represents an increment value for the voltage of the erasing pulse, and a sequence such as 0.1, 0.1, 0.2 . . . (V) is set, for example. Variable $\Delta 1$ may be fixed to 0.1 (V), instead of the sequence as above. A variable $\Delta V2$ represents an increment value for the voltage of the erasing pulse, and a sequence such as 0.2, 0.3, 0.5 . . . (V) is set, for example. Variable $\Delta 2$ may be fixed to 0.2 (V), instead of the sequence as above.

A variable A represents a pulse width, and is set to a value such as 2 (ms), for example. A variable B represents a pulse width, and is set to a value such as 3 (ms), for example. A variable K represents the number of times of continuous pulse application, and is set to a value such as 2 (times), for example. A variable $\Delta t$ represents an increment value for the pulse width, and a sequence such as 1, 1, 1 . . . (ms) is set, for example. By allowing reading of a variety of parameters as variables as described above, even when memory transistors have characteristics different from one another, the variables should only be modified.

Referring again to FIG. 2, when reading of the variable in step S1 is completed, the process proceeds to step S2 successively. In step S2, the number of times of pulse application or the pulse voltage is initialized. Then, the process proceeds to step S3. In step S3, erase verify is performed. In verifying erasing, verify circuit 16 in FIG. 1 reads data from memory cell array 20, so as to determine whether or not erasing is completed. Then, if determination as failure is made as a result of erase verify in step S3, the process proceeds to step S4, in which the erasing pulse is applied as will be described in detail later. Then, the process returns to step S3 again for erase verify.

When determination as pass is made as a result of erase verify in step S3, the block erasing operation is completed.

Figure 4:
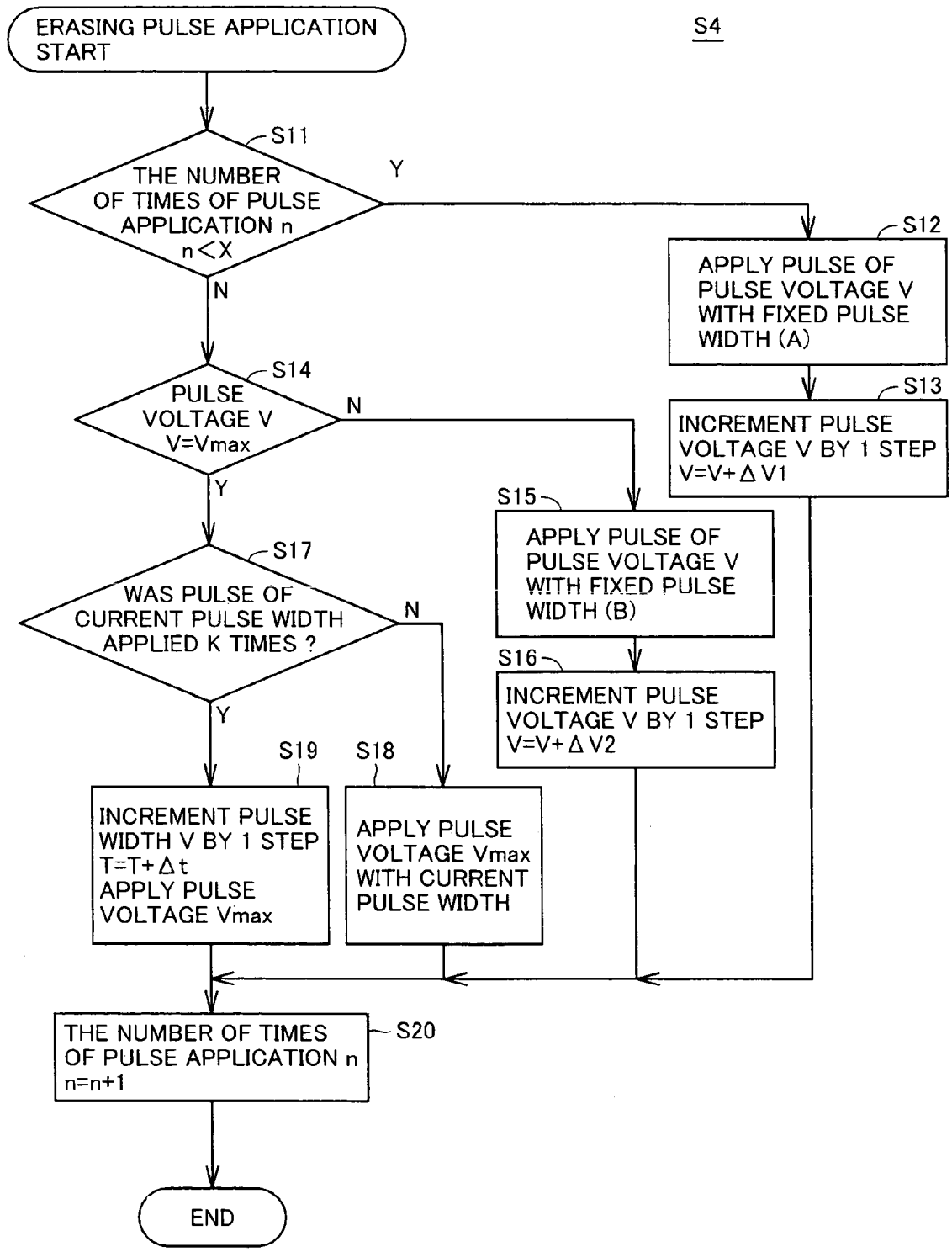
FIG. 4 is a flowchart illustrating in detail an operation performed in step S4 in which an erasing pulse in FIG. 2 is applied.

FIG. 4 is a flowchart illustrating in detail an operation performed in step S4 in which the erasing pulse in FIG. 2 is applied.

Referring to FIG. 4, when an erasing pulse application operation in step S4 is started, initially, whether or not the number of times of pulse application n is smaller than X is determined in step S11. Here, X has been set to 13 in FIG. 3, for example. If it is determined that the number of times of pulse application n is smaller than variable X in step S11, the process proceeds to step S12, in which a pulse of a fixed pulse width (A) and pulse voltage V is applied. Then, the process proceeds to step S13, in which setting so as to increase pulse voltage V by 1 step is performed.

Figure 5:
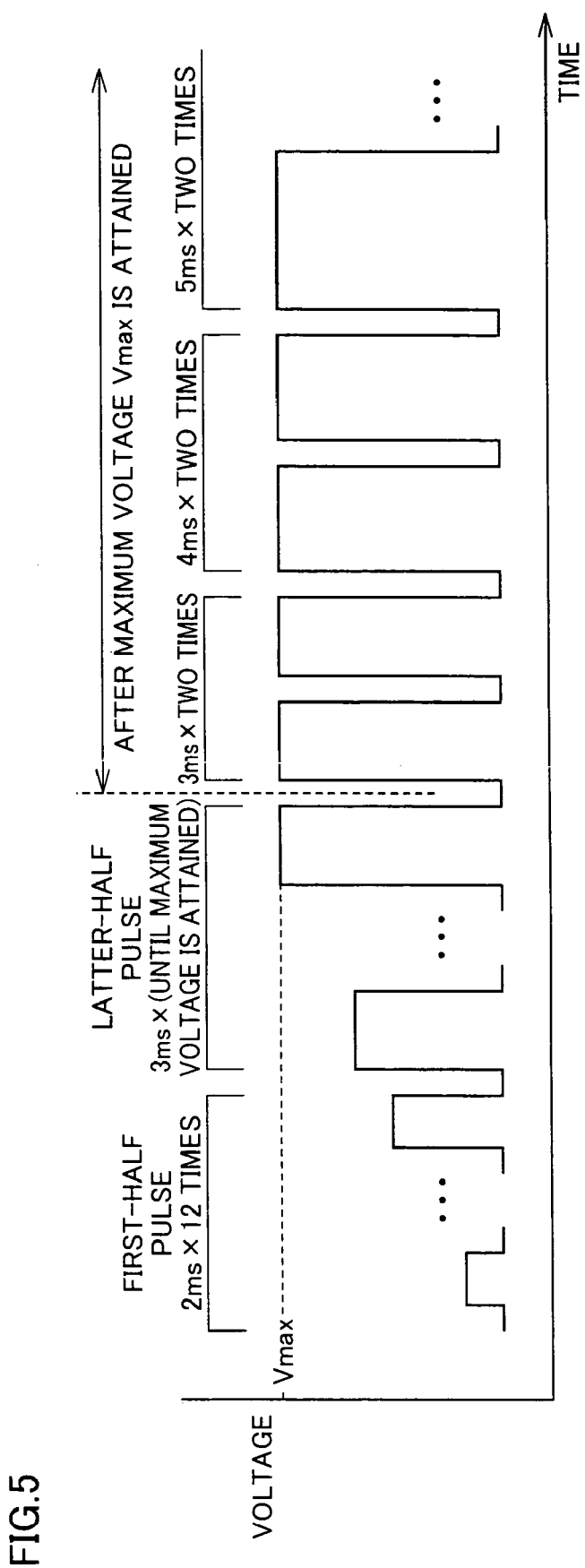
FIG. 5 is a waveform diagram illustrating a process in which the erasing pulse is repeatedly applied.

FIG. 5 is a waveform diagram for illustrating a process in which the erasing pulse is repeatedly applied.

If variable X is set to 13, the pulse width is fixed to A (2 ms, for example) until the number of times of pulse application n reaches 12, and the pulse voltage is increased each time. For example, increase in the pulse voltage is determined in accordance with a sequence held as variable $\Delta 1$, as shown in FIG. 2. Alternatively, the increment may be set to a fixed value, instead of the sequence.

Referring again to FIG. 4, when step S13 ends, the process proceeds to step S20, in which the number of times of pulse application n is increased by 1. Then, when pulse application is completed as shown in FIG. 2, erase verify in step S3 is again performed. In this manner, until the number of times of pulse application exceeds X, pulse application is repeated in the order of steps S11, S12, S13, and S20. This operation corresponds to a section described as a first-half pulse in FIG. 5.

If it is determined that the number of times of pulse application n is not smaller than X in step S11, the process proceeds to step S14, in which whether or not pulse voltage V has attained maximum voltage Vmax is determined. If pulse voltage V has not yet attained maximum voltage Vmax, the process proceeds to step S15, in which the pulse of a fixed pulse width (B) and pulse voltage V is applied.

Then, the process proceeds to step S16, in which pulse voltage V is increased by 1 step. When step S16 is completed, the process proceeds to step S20, in which the number of times of pulse application n is incremented.

A process through steps S15 and S16 corresponds to a latter-half pulse application in FIG. 5. As shown in FIG. 3, for example, in the latter-half pulse application, when variable B representing the pulse width is set to 3 ms, the pulse of a pulse width of 3 ms is applied until the pulse voltage attains the maximum voltage.

Referring again to FIG. 4, when pulse voltage V attains maximum voltage Vmax in step S14, the process proceeds to step S17. In step S17, whether or not K times of pulse application with a current pulse width have been performed is determined. The waveform in FIG. 5 shows an example in which K is set to 2. If K times of pulse application have not yet been performed, the process proceeds to step S18, and pulse voltage Vmax is again applied, with the current pulse width. When step S18 is completed, the process proceeds to step S20, in which the number of times of pulse application n is incremented.

On the other hand, if it is determined that K times of application with the current pulse width have been performed in step S17, the process proceeds to step S19, in which the pulse width is increased by 1 step. Then, pulse voltage Vmax is applied. When step S19 is completed, the process proceeds to step S20, in which the number of times of pulse application n is incremented.

As shown in FIG. 5, the process through steps S18 and S19 corresponds to a pulse application operation in which the pulse of a width of 3 ms is initially applied two times after the maximum voltage is attained, then the pulse of a width of 4 ms with the maximum voltage is applied two times, and the pulse of a width of 5 ms with the maximum voltage is applied two times. In this manner, the pulse application voltage is not increased until maximum voltage Vmax is exceeded. This is because a withstand voltage of a transistor is not exceeded in a path for applying a voltage from the power supply circuit in FIG. 1 through a decoder to memory cell array 20.

Figure 6:
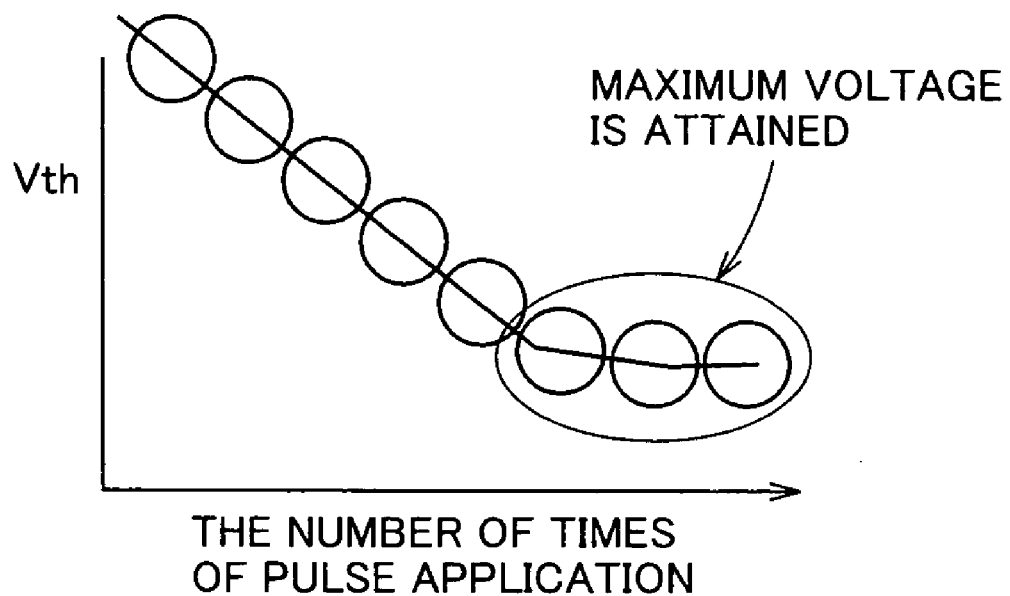
FIG. 6 shows change of a threshold voltage of a memory cell when a pulse is applied with its pulse width being maintained constant.

FIG. 6 shows change of a threshold voltage of a memory cell when a pulse is applied with its pulse width being maintained constant.

Figure 7:
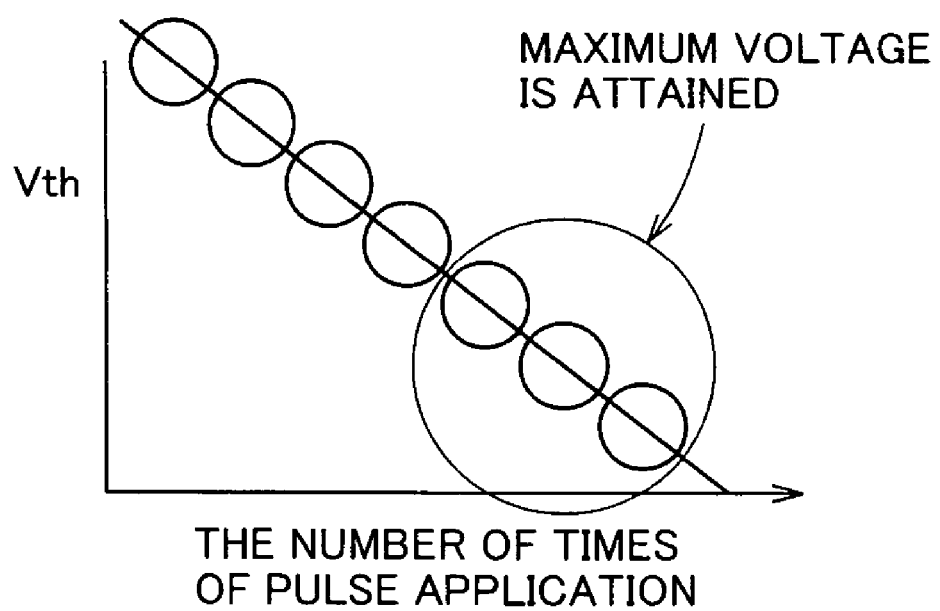
FIG. 7 illustrates change of the threshold voltage when a waveform as shown in FIG. 5 is applied.

FIG. 7 illustrates change of the threshold voltage when a waveform as shown in FIG. 5 is applied.

Referring to FIGS. 6 and 7, when the pulse application is continued with the pulse width being fixed, change of the threshold voltage is no longer linear with respect to the number of times of pulse application after the voltage of the applied pulse has attained the maximum voltage, as shown in FIG. 6. On the other hand, if a pulse width per one application is gradually made larger after the maximum voltage is attained as shown in FIG. 5, change of the threshold voltage can be more linear than in the case of FIG. 6 even after the pulse voltage has attained the maximum voltage. Therefore, a time period for block erasing can be shortened, and a non-volatile semiconductor memory device allowing an efficient operation, of which contents can be erased with high speed, can be provided.

Embodiment 2

Figure 8:
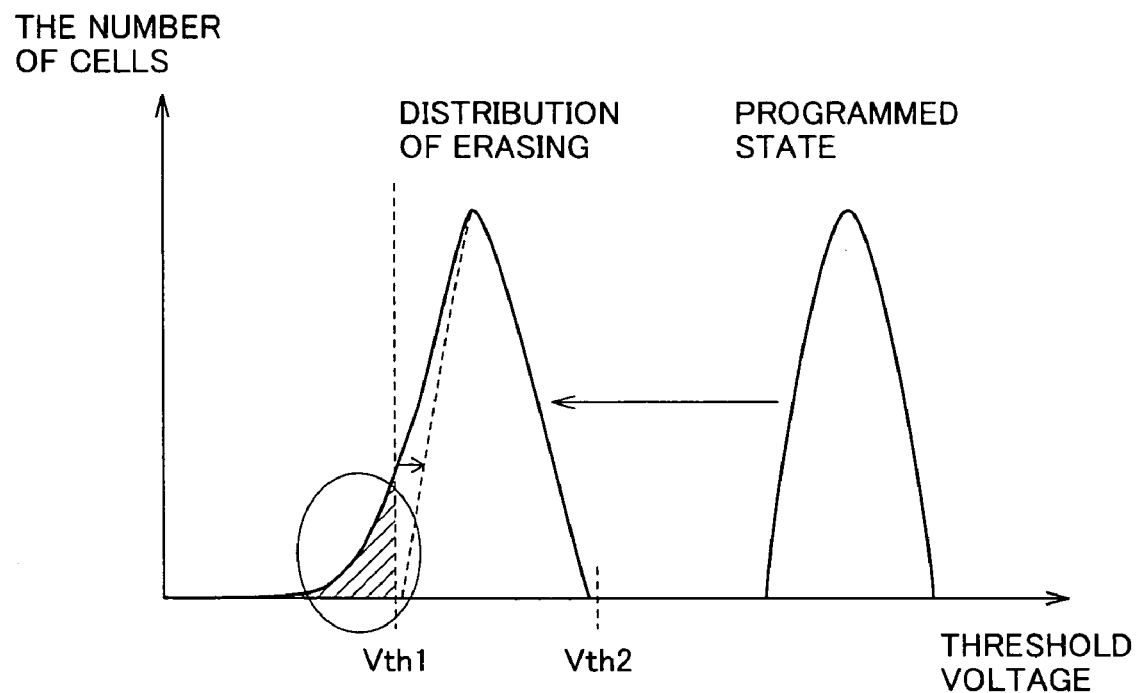
FIG. 8 illustrates an overerase recovery (OER) operation for recovering from an overerased state.

FIG. 8 illustrates an overerase recovery (OER) operation for recovering from an overerased state.

Referring to FIG. 8, when the erasing pulse is applied to the memory cells in the memory block collectively, that are in a programmed state and have a high threshold value, distribution of the threshold voltage of the memory cell is shifted toward a smaller threshold voltage. When the erasing pulse is applied collectively until the threshold value of all memory cells in the memory block is varied to a value not larger than a threshold voltage Vth, a memory cell of which threshold voltage is smaller than a threshold voltage Vth1 which is the lower limit of the threshold voltage during erasing may be present. Such a memory cell is referred to as an overerased bit. Here, there is an operation to return such an overerased bit to the inside of prescribed distribution of the threshold voltage by generating channel hot electrons (CHE) for each bit in the memory cell so that the threshold voltage is larger than threshold voltage Vth1. Such an operation is referred to as overerase recovery (hereinafter, abbreviated as OER).

Figure 9:
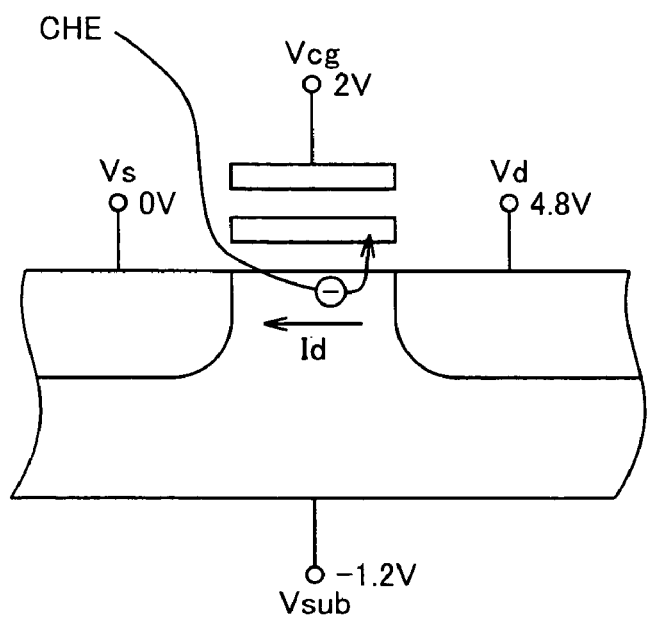
FIG. 9 illustrates a voltage application state in OER.

FIG. 9 illustrates a voltage application state in OER.

Referring to FIG. 9, a source potential Vs of the memory cell transistor is set to 0V. A substrate potential Vsub is set to a negative potential, for example, to −1.2V. A drain potential is set to a positive potential, for example, to +4.8V.

In such a state, when a potential Vcg of a control electrode (also referred to as a control gate) is set to approximately 2V, for example, a large amount of drain current Id flows in the memory cell transistor having a small threshold voltage, whereas drain current Id hardly flows in the transistor having a relatively high threshold voltage. If a voltage is applied simultaneously to a plurality of memory cell transistors, change of the threshold voltage is selectively caused in the memory cell transistor having a low threshold voltage. In this manner, increase in the threshold voltage by feeding the drain current so as to generate channel hot electrons advantageously enables accurate control for each bit. On the other hand, as the drain current is large, collective writing to the block using such channel hot electrons as above cannot be performed.

Meanwhile, when the erasing pulse is applied, an FN tunneling current is fed from the substrate to the floating gate so as to change the threshold voltage. As the value of the FN tunneling current is not sufficiently large, collective erasing from or collective writing in the memory block is possible, although accuracy in writing is not sufficient. If a current is applied by a unit smaller than a block for achieving accurate writing, wells forming the memory cell should be separated from each other for each unit of application target. Therefore, a layout area of the memory cell array becomes large, which is not realistic.

Figure 10:
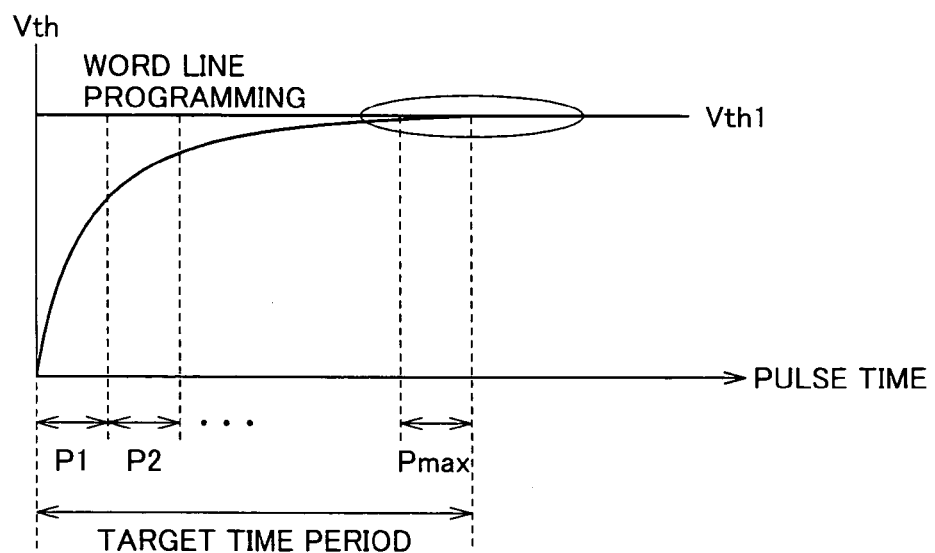
FIG. 10 illustrates pulse application in the OER operation in Embodiment 2.

FIG. 10 illustrates pulse application in the OER operation in Embodiment 2.

Referring to FIG. 10, normally in the OER operation, the pulse is applied to each bit, and a verify operation is performed for each pulse application. Then, whether or not the threshold voltage is higher than a prescribed voltage is checked, and thereafter whether or not a further pulse is to be applied is determined. As described previously, however, the threshold voltage does not shift to a level exceeding the potential of the control electrode Vcg. This is because the drain current no longer flows due to increase in the threshold voltage and because the channel hot electrons are not generated. Therefore, for saving time, the verify operation for each pulse application is not performed.

As shown in FIG. 10, it is desirable to continue to apply the pulse until a target time has passed, and to stop pulse application when the target time period has passed. As shown with P1, the threshold voltage increases in response to first pulse application, while in second pulse application P2, the threshold voltage does not exhibit change as large as that during pulse application P1. In Pmax in which pulse application has been performed as many times as comparable to the target time period, the threshold voltage exhibits almost no change.

Furthermore, in Embodiment 2, for saving time for erasing, the pulse is simultaneously applied to a plurality of bits in the OER operation. Though it is difficult in terms of current supply capability to feed the drain current collectively to a whole block, it is possible to feed the same to several bits.

Figure 11:
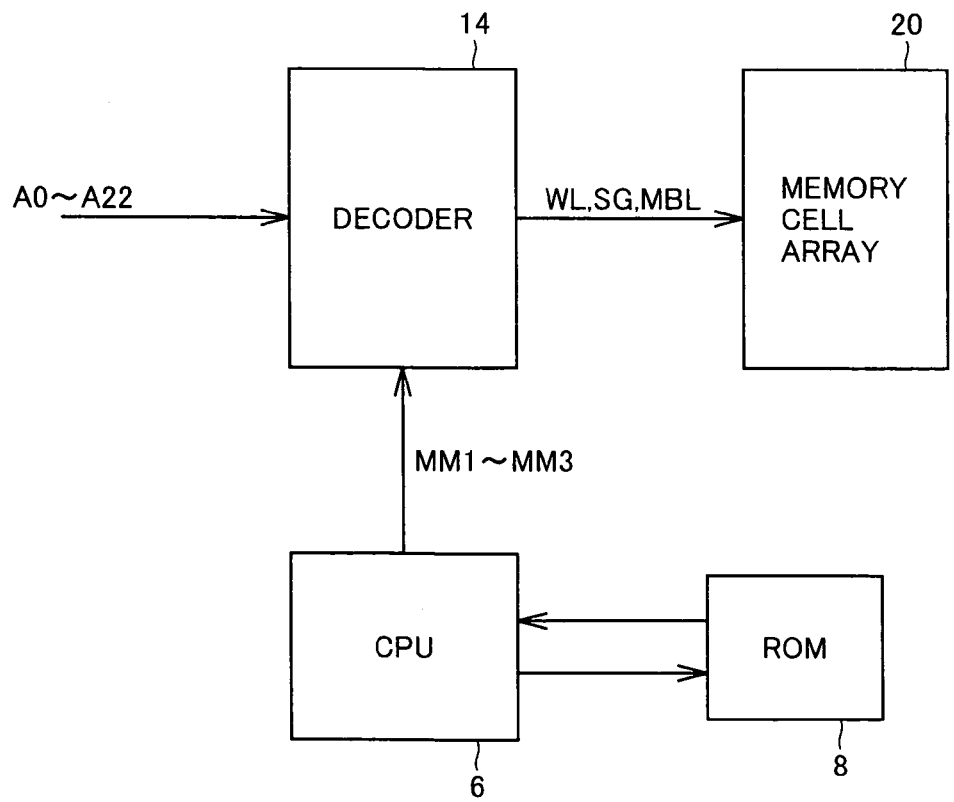
FIG. 11 is a block diagram illustrating a configuration in which a plurality of bits are selected in Embodiment 2.

FIG. 11 is a block diagram illustrating a configuration in which a plurality of bits are selected in Embodiment 2.

Referring to FIG. 11, CPU 6 outputs control signals MM1 to MM3 for selecting a plurality of bits to decoder 14. Decoder 14 selects a word line WL, a select gate line SG, and a main bit line MBL upon receiving address signals A0 to A22 and control signals MM1 to MM3, so as to designate a memory cell in memory cell array 20, in which OER is to be performed.

Figure 12:
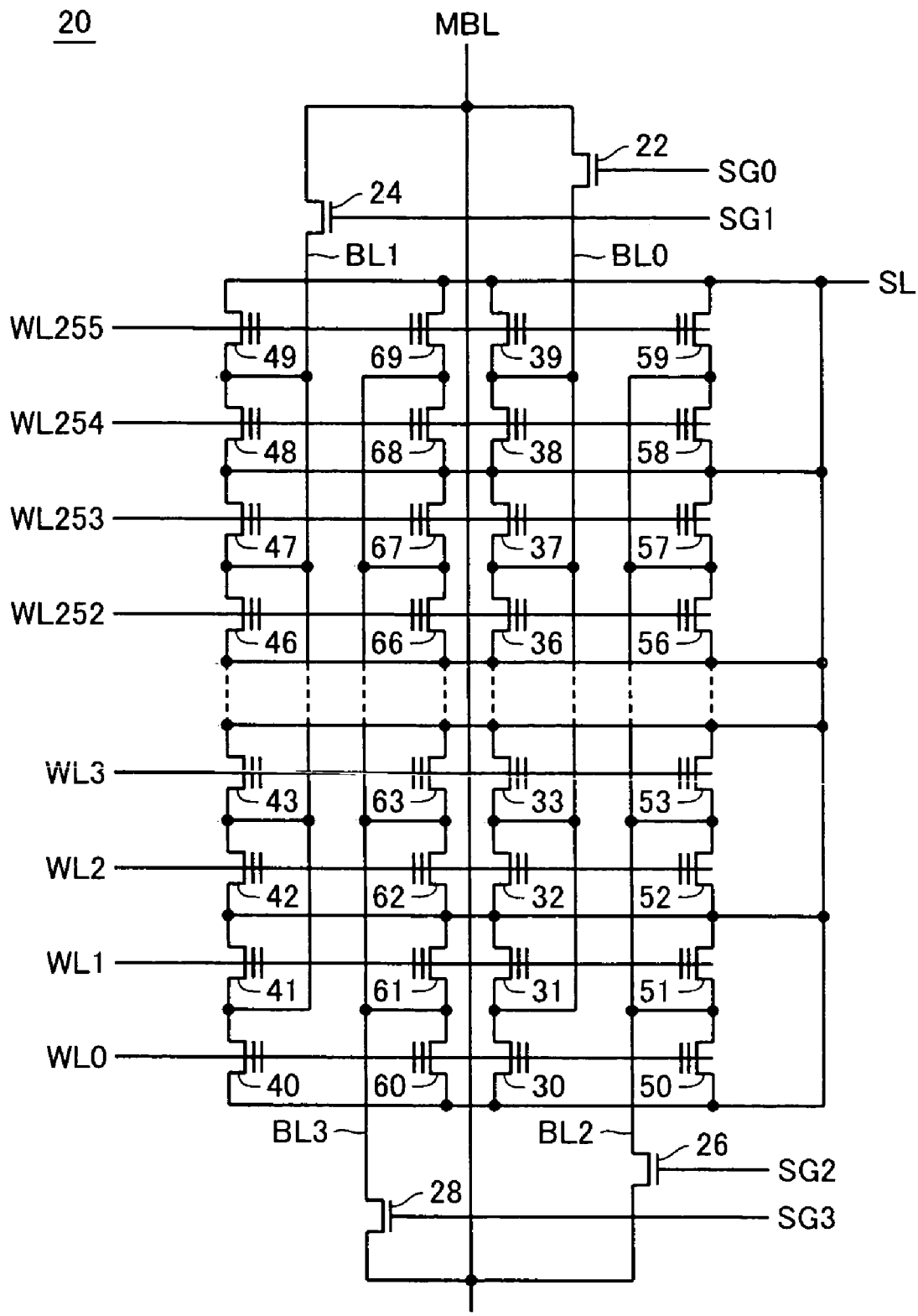
FIG. 12 is a circuit diagram schematically showing a memory block in a memory cell array 20.

FIG. 12 is a circuit diagram schematically showing a memory block in memory cell array 20.

Referring to FIG. 12, a configuration of one main bit line MBL will now be described.

Memory cell array 20 includes select transistors 22, 24, 26, and 28. Select transistors 22, 24, 26, and 28 select bit lines BL0 to BL3 in accordance with select gate lines SG0 to SG3, respectively.

Memory cell array 20 further includes memory transistors 30, 31, 32, and 33 having each source connected to a source line SL, having each drain connected to bit line BL0, and having the gates connected to word lines WL0, WL1, WL2, and WL3 respectively. The memory transistor is implemented as a two-layer gate MOS transistor sandwiching a floating gate between the control gate and a substrate.

Memory cell array 20 further includes memory transistors 36, 37, 38, and 39 having each source connected to source line SL, having each drain connected to bit line BL0, and having the gates connected to word lines WL252, WL253, WL254, and WL255 respectively.

Memory cell array 20 further includes memory transistors 40, 41, 42, and 43 having each source connected to source line SL, having each drain connected to bit line BL1, and having the gates connected to word lines WL0, WL1, WL2, and WL3 respectively.

Memory cell array 20 further includes memory transistors 46, 47, 48, and 49 having each source connected to source line SL, having each drain connected to bit line BL1, and having the gates connected to word lines WL252, WL253, WL254, and WL255 respectively.

Memory cell array 20 further includes memory transistors 50, 51, 52, and 53 having each source connected to source line SL, having each drain connected to bit line BL2, and having the gates connected to word lines WL0, WL1, WL2, and WL3 respectively.

Memory cell array 20 further includes memory transistors 56, 57, 58, and 59 having each source connected to source line SL, having each drain connected to bit line BL2, and having the gates connected to word lines WL252, WL253, WL254, and WL255 respectively.

Memory cell array 20 further includes memory transistors 60, 61, 62, and 63 having each source connected to source line SL, having each drain connected to bit line BL3, and having the gates connected to word lines WL0, WL1, WL2, and WL3 respectively.

Memory cell array 20 further includes memory transistors 66, 67, 68, and 69 having each source connected to source line SL, having each drain connected to bit line BL3, and having the gates connected to word lines WL252, WL253, WL254, and WL255 respectively.

Figure 13:
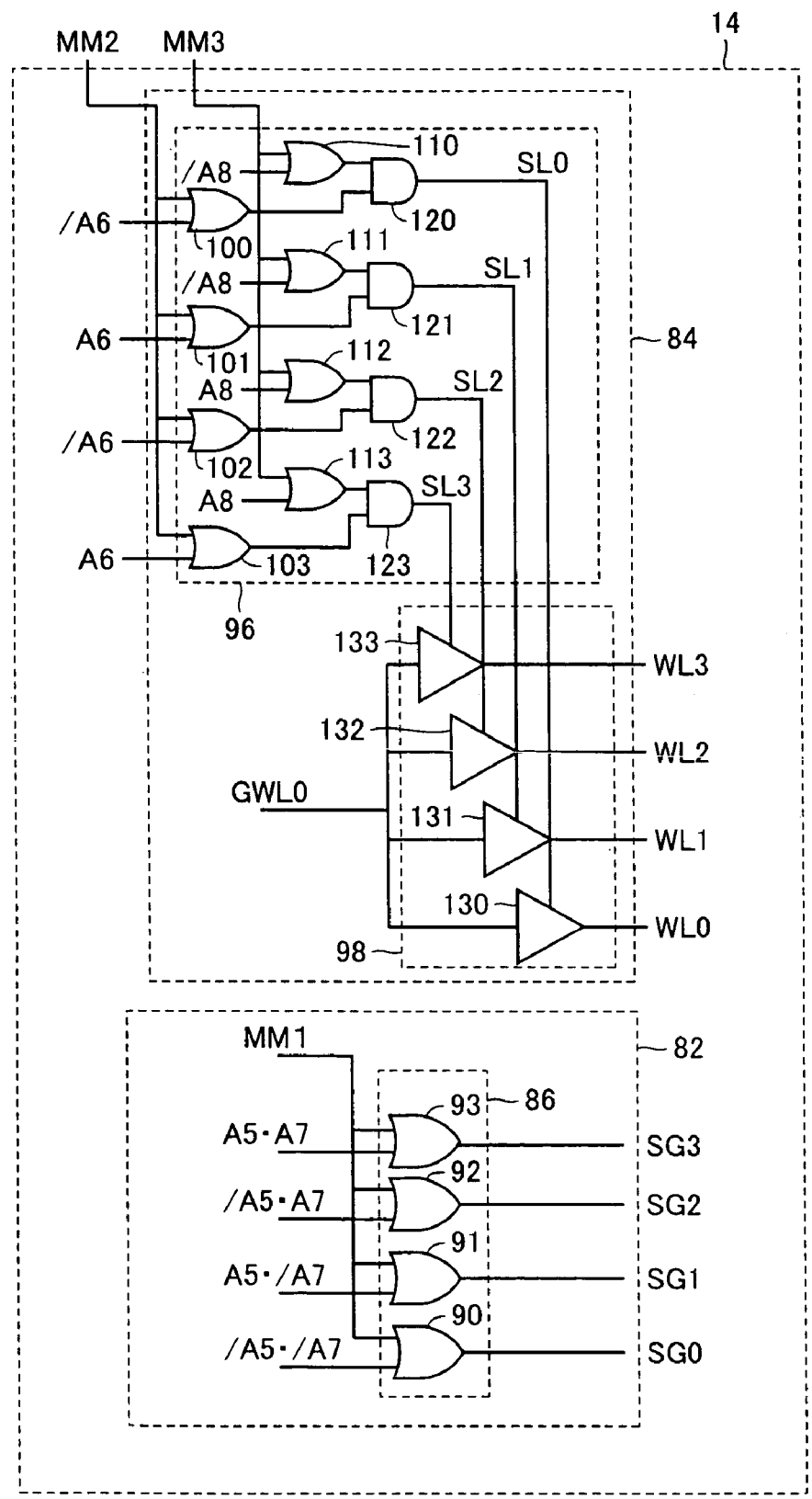
FIG. 13 is a circuit diagram showing a configuration of a decoder 14 in FIG. 11.

FIG. 13 is a circuit diagram showing a configuration of decoder 14 in FIG. 11.

Referring to FIG. 13, decoder 14 includes a bit line decode circuit 82 activating select gate lines SG0 to SG3 in response to address signals A5 and A7, and a word line decode circuit 84 selecting word lines WL0 to WL3 in response to address signals A6 and A8.

Bit line decode circuit 82 includes a gate circuit 86 capable of collectively activating select gate lines SG0 to SG3 by masking a signal predecoded by a not-shown predecode circuit using control signal MM1.

Gate circuit 86 includes an OR circuit 90 activating select gate line SG0 upon receiving predecode signals /A5•/A7 and control signal MM1, an OR circuit 91 activating select gate line SG1 upon receiving predecode signals A5•/A7 and control signal MM1, an OR circuit 92 activating select gate line SG2 upon receiving predecode signals /A5•A7 and control signal MM1, and an OR circuit 93 activating select gate line SG3 upon receiving predecode signals A5•A7 and control signal MM1.

Word line decode circuit 84 includes a word line driver 98 selecting word lines WL0 to WL3 in response to select signals SL0 to SL3 respectively by drivers 130 to 133 when a global word line GWL0 is selected, and a gate circuit 96 outputting select signals SL0 to SL3 in response to address signals A6, A8 and control signals MM2, MM3.

Gate circuit 96 includes an OR circuit 100 receiving an address signal/A6 and control signal MM2, an OR circuit 101 receiving address signal A6 and control signal MM2, an OR circuit 102 receiving address signal/A6 and control signal M and an OR circuit 103 receiving address signal A6 and control signal MM2.

Gate circuit 96 further includes an OR circuit 110 receiving an address signal /A8 and control signal MM3, an OR circuit 111 receiving address signal/A8 and control signal MM3, an OR circuit 112 receiving address signal A8 and control signal MM3 and an OR circuit 113 receiving address signal A8 and control signal MM3.

Gate circuit 96 further includes an AND circuit 120 outputting select signal SL0 upon receiving an output from OR circuit 100 and an output from OR circuit 110, an AND circuit 121 outputting select signal SL1 upon receiving an output from OR circuit 101 and an output from OR circuit 111, an AND circuit 122 outputting select signal SL2 upon receiving an output from OR circuit 102 and an output from OR circuit 112), and an AND circuit 123 outputting select signal SL3 upon receiving an output from OR circuit 103 and an output from OR circuit 113.

As can be seen from FIGS. 12 and 13, when control signal MM1 is activated, select gate lines SG0 to SG3 are all activated. Then, four bit lines are simultaneously selected, to each of which write data is transmitted.

In addition, when control signal MM2 is at H level and control signal MM3 is at L level, word lines WL2 and WL3 are simultaneously selected if address signal A8 is at H level regardless of address signal A6. When address signal/A8 is at H level, word lines WL0 and WL1 are simultaneously selected.

When control signals MM2 and MM3 are both at H level and selected, select signals SL0 to SL3 are all activated to H level. When global word line GWL0 is selected, word lines WL0 to WL3 are all selected. In this manner, by controlling control signals MM1 to MM3, the number of memory cells selected in OER can be varied. Depending on a balance between a current characteristic of the memory cell and power supply current feeding capability of the power supply circuit, the number of cells that can be selected at one time is varied. In order to adapt to such variation, the number of memory transistors selected in a multiple number can freely be modified by an instruction from the CPU.

The setting of the number of transistors to be selected can be varied by modifying control signals MM1 to MM3 in the following manner, when an output is of 16 bits, that is, there are 16 data output terminals.

First, when control signals MM1 to MM3 are all at L level, the OER operation is performed on one word, that is, on one memory transistor per one output terminal. Such an operation is the same as in normal OER, and is time-consuming. On the other hand, as the current supply capability of the power supply circuit is sufficient, shift of the threshold voltage can be ensured.

Then, when control signal MM1 is set to H level and control signals MM2 and MM3 are set to L level, multiple selection of 4 words is possible. Here, address signal bits A<14:8>, A<6> and A<4:0> should sequentially be incremented as address increment in the OER operation.

When control signals MM1 and MM2 are set to H level and control signal MM3 is set to L level, multiple selection of 8 words is possible. Here, address signal bits A<14:8> and A<4:0> should sequentially be incremented as address increment.

When control signals MM1 to MM3 are all set to H level, multiple selection of 16 words is possible. Here, address signal bits A<14:9> and A<4:0> should sequentially be incremented. These address increment methods are controlled by reading by CPU 6 of software codes stored in ROM 8.

Figure 14:
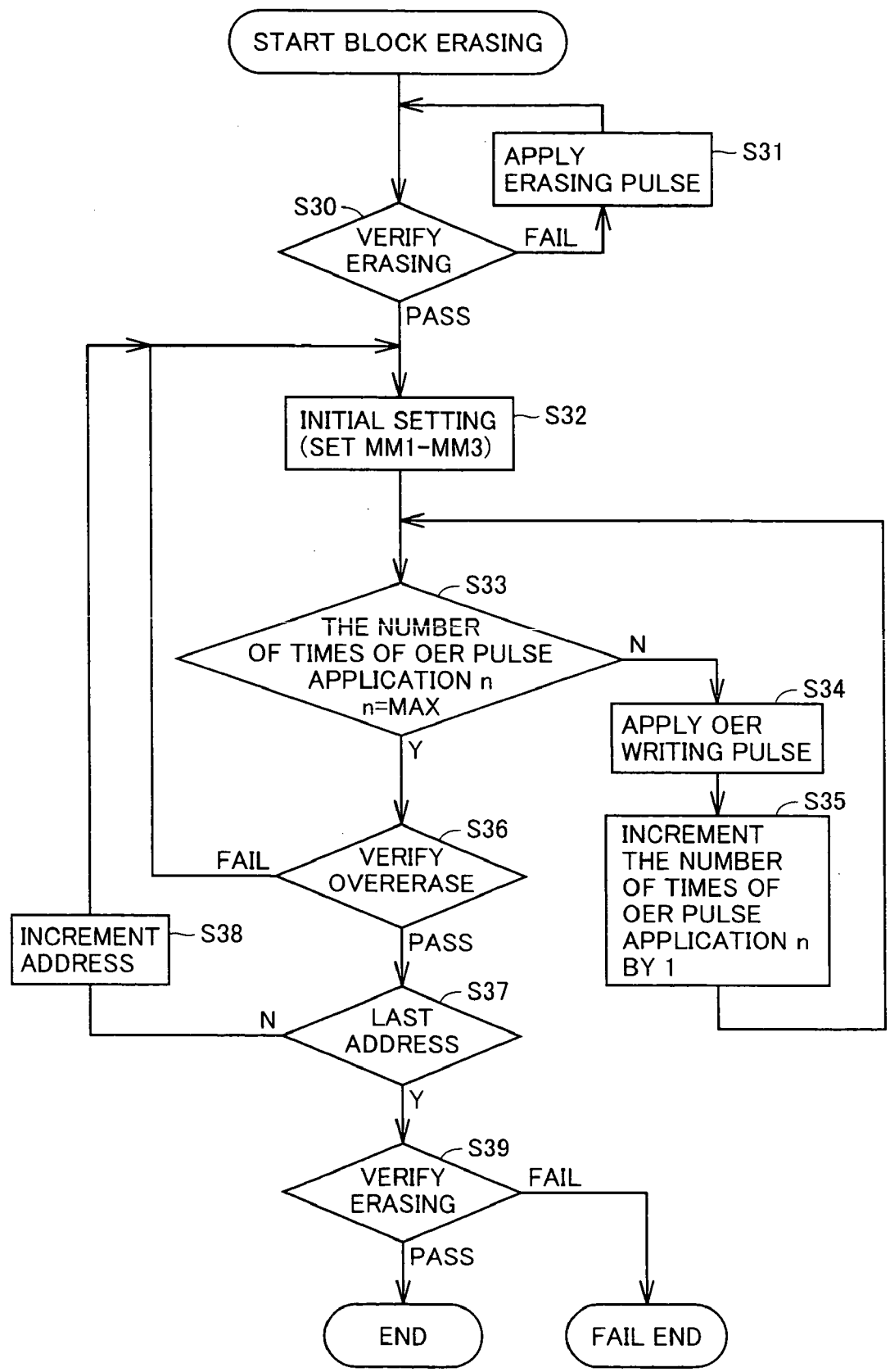
FIG. 14 is a flowchart illustrating control of block erasing in Embodiment 2.

FIG. 14 is a flowchart illustrating control of block erasing in Embodiment 2.

Referring to FIG. 14, when block erasing is started, initially, erase verify is performed in step S30. If determination as failure is made as a result of erase verify, the erasing pulse is applied to the memory block collectively in step S31 until the threshold voltage becomes smaller than a threshold voltage Vth2 in FIG. 8. Here, application, of the erasing pulse causes change in the threshold voltage by the FN tunneling current.

When determination as pass is made as a result of erase verify in step S30, the process proceeds to step S32, in which an operation for initial setting is performed. In the initial setting operation, the maximum number MAX of times of OER pulse application is set, and setting of control signals MM1 to MM3 is carried out, for example.

In step S33, whether or not the number of times of OER pulse application n matches with MAX corresponding to the target time period is determined. If the number of times of OER pulse application has not yet attained MAX, the process proceeds to step S34, and as shown with P1 in FIG. 10, the overerase recovery writing pulse is applied so as to increase the threshold voltage. Then, the process proceeds to step S35, in which the number of times of OER pulse application n is incremented, and the process returns to step S33.

In this manner, steps S33 to S35 are repeated until the target time period in FIG. 10 has passed. If it is assumed that the number of times of application attains MAX and the threshold voltage of the overerased bit is shifted to a value around the lower limit of the threshold voltage, the process proceeds to step S36, in which overerase verify is performed. As the characteristics of the memory cell transistors are varied among one another, determination as failure is sometimes made as a result of overerase verify. In such a case, the process returns to step S32 for a prescribed times of OER writing pulse application.

On the other hand, when determination as pass is made as a result of overerase verify in step S36, the process proceeds to step S37, in which whether or not the address of the bit subjected to OER process is final is determined. If the address is not final, the process proceeds to step S38, in which the address is incremented. Here, a bit to be incremented is different, depending on the setting of control signals MM1 to MM3. When the address is incremented, the process proceeds to step S32, in which the OER pulse is again applied.

If it is determined that the address is final in step S37, the process proceeds to step S39, in which erase verify is performed. If determination as pass is made as a result of erase verify, the process ends. If determination as failure is made, the process ends with fail end.

Here, a soft flash programming operation may be performed between steps S30 and S32, in order to slightly increase the threshold voltage of the overerased bit as a whole block.

In the normal OER operation, initially, overerase verify is performed with respect to all addresses, and then the OER pulse is applied solely to the bits requiring the OER pulse. Accordingly, as all addresses are verified, the normal OER operation is time-consuming. In addition, as the OER pulse is applied to the bits that have been determined as failure as a result of verify, a time period for pulse application for each 1 bit is increased as the number of failed bits increases, resulting in longer time for block erasing as a whole. In the worst case, a chip may fail due to time out of erasing time.

In contrast, in the OER operation described in Embodiment 2, a plurality of bits can be selected for application of the overerase recovery pulse. Accordingly, the time period for block erasing can be shortened by applying the OER pulse at one time to a plurality of bits selected out of all memory cells, without overerase verify after determination as pass is made as a result of erase verify in step S30 in FIG. 14.

In addition, the number of memory cells that can be selected at one time can be varied in accordance with control signals MM1 to MM3, and the target time period can also be modified by varying variable MAX at the initial setting. Therefore, the present embodiment can adapt to flash memories having different characteristics solely by varying the variable.

Particularly, it is basically assumed that control signal MM1 attains H and SG0 to SG3 are all selected. Then, if the number to be selected is increased, a method of selecting a plurality of main bit lines so as to further select a memory column and a method of selecting a plurality of word lines so as to select a memory row are possible. The method of selecting a plurality of main bit lines, however, is disadvantageous because of excessively large sum of the currents fed to the memory cell. Therefore, if the number to be selected is increased, multiple word lines are selected by control signals MM2 and MM3, without additionally selecting the memory column.

In other words, additional multiple selection is performed not using the bit line but using the word line. This is because reduction in an overall current is achieved by selecting multiple word lines more advantageously than by further selecting multiple bit lines, considering voltage lowering at select gates 22 to 28, as the current has originally been suppressed by the size of select gates 22 to 28.

Embodiment 3

Embodiment 3 is directed to stable control by changing a manner of voltage application in a non-volatile semiconductor memory device storing information by controlling the threshold value of the memory transistor by storing electrons in a floating gate with the channel hot electron writing method.

One example of a threshold voltage control operation in a non-volatile semiconductor memory device is a channel hot electron injection method.

Figure 15:
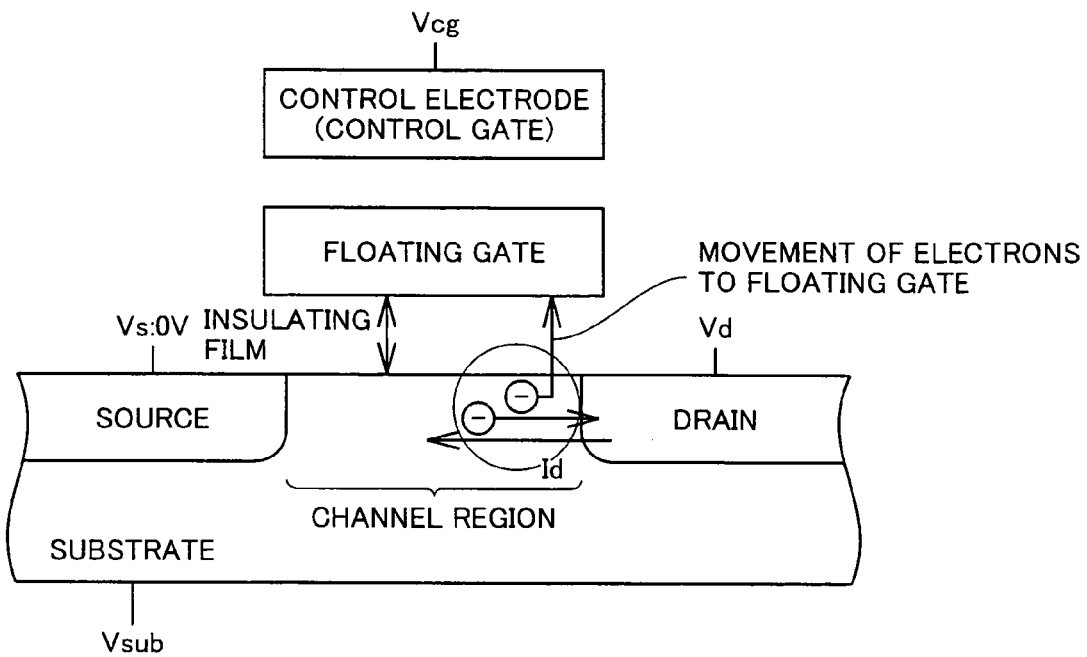
FIG. 15 illustrates injection of channel hot electrons.

FIG. 15 illustrates injection of channel hot electrons.

Referring to FIG. 15, when the source of the memory transistor is set to 0V, a voltage Vd is applied to the drain, and a potential Vcg is applied to the control electrode, the drain current flows from the drain to the source. Then, some electrons are injected to the floating gate. This is referred to as channel hot electron injection. Here, a sufficient potential difference should be present between the drain and the source so that electrons to be moved toward the floating gate are sufficiently generated in the vicinity of the drain of a channel region.

Figure 16:
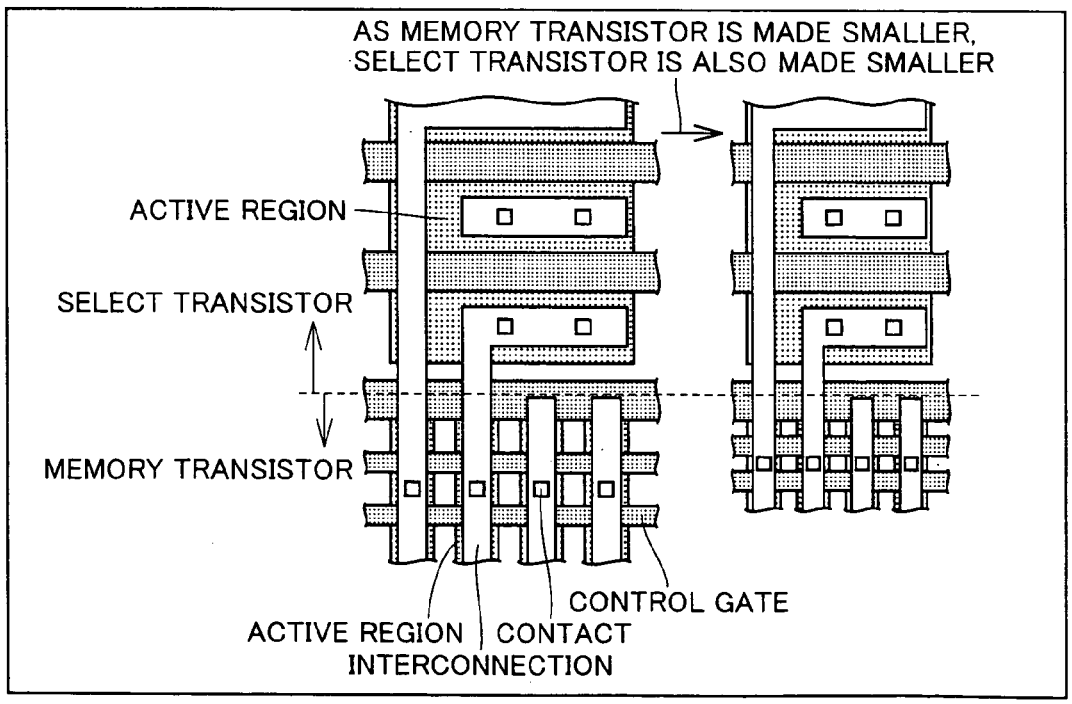
FIG. 16 illustrates a manner that a select transistor is made smaller as a memory transistor is made smaller.

FIG. 16 illustrates a manner that a select transistor is made smaller as a memory transistor is made smaller.

Referring to FIG. 16, as the memory transistor is reduced in size for miniaturization, the transistor supplying a voltage to the drain of the memory transistor, that is, the select transistor, is also reduced in size. When the size of the select transistor is made smaller, the voltage supply capability to the drain of the memory transistor is lowered. Namely, when a current flows, lowering in the voltage is significant due to a large resistance value. Accordingly, when a current is fed between the source and the drain with a method similar to the control method performed before the memory transistor is made smaller, the drain voltage of the memory transistor is disadvantageously lowered.

Figure 17:
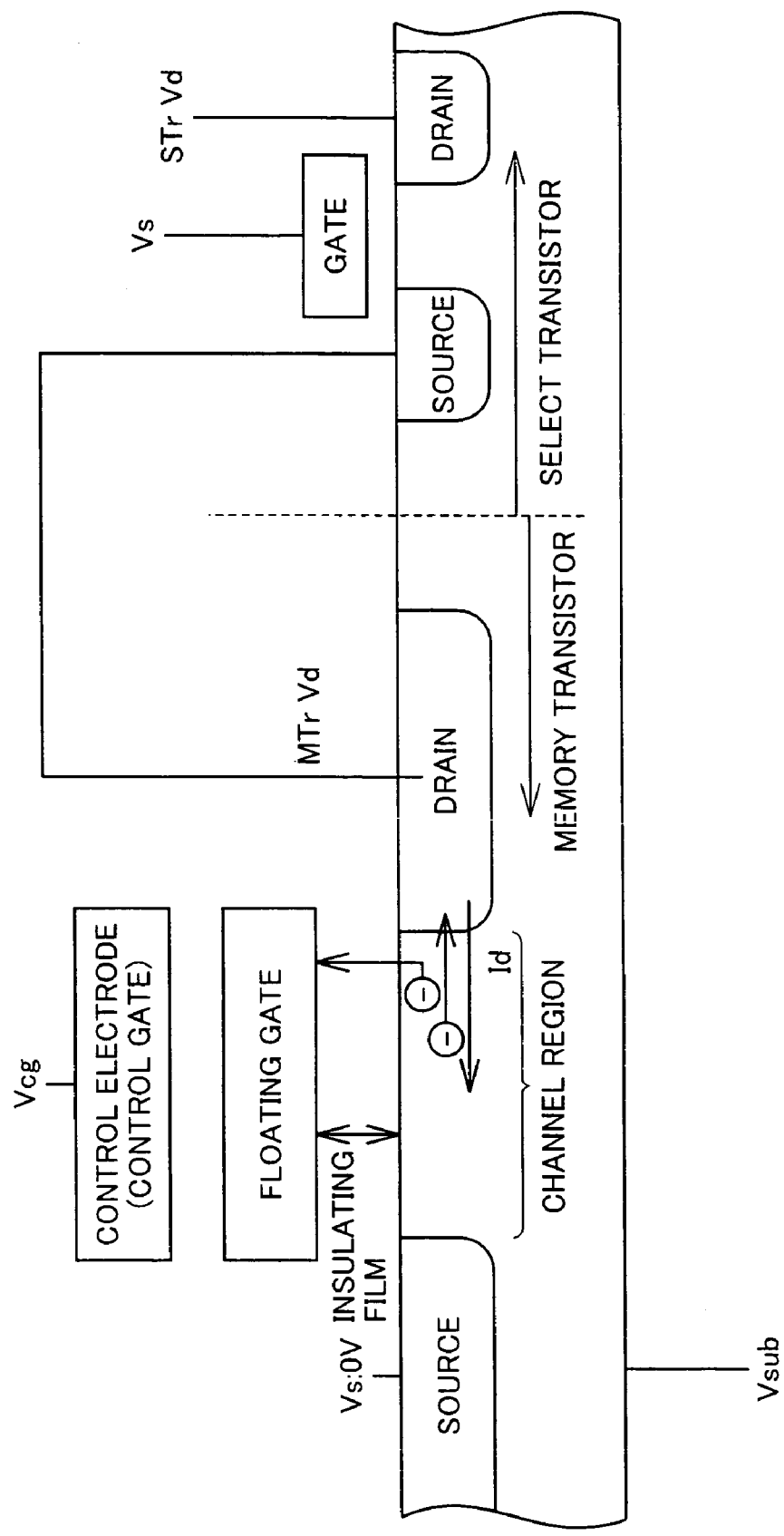
FIG. 17 is a schematic diagram showing a cross-section of the memory transistor and the select transistor.

FIG. 17 is a schematic diagram showing a cross-section of the memory transistor and the select transistor.

Referring to FIG. 17, when a resistance of the select transistor is increased due to reduction in its size, lowering in the voltage due to the resistance value of the select transistor is also significant. When a drain voltage MTrVd applied to the memory transistor becomes lower than a drain voltage STrVd applied to the select transistor, the drain current does not flow in the memory transistor. Here, electrons sufficient for channel hot electron injection are not generated, resulting in difficulty in controlling the threshold voltage.

In other words, when the select transistor is configured differently, in particular when a channel width is narrowed, an on-resistance is increased and the voltage supply capability is lowered. In such a case, when drain current Id exceeds a certain level, voltage MTrVd cannot sufficiently be supplied.

It is possible to extend a time for control of the threshold voltage, and to suppress the current flowing between the source and the drain of the memory transistor, so as to gradually vary the threshold value. On the other hand, as the time for control is determined so as to be within a prescribed time period in accordance with the specifications of a product, blindly extending the time is not permitted. Therefore, in order not to cause lowering in the drain voltage, it is necessary to modify the control method so that the control operation is completed within the control time of the same length as in the conventional product while suppressing the drain current flowing between the source and the drain of the memory transistor.

Figure 18:
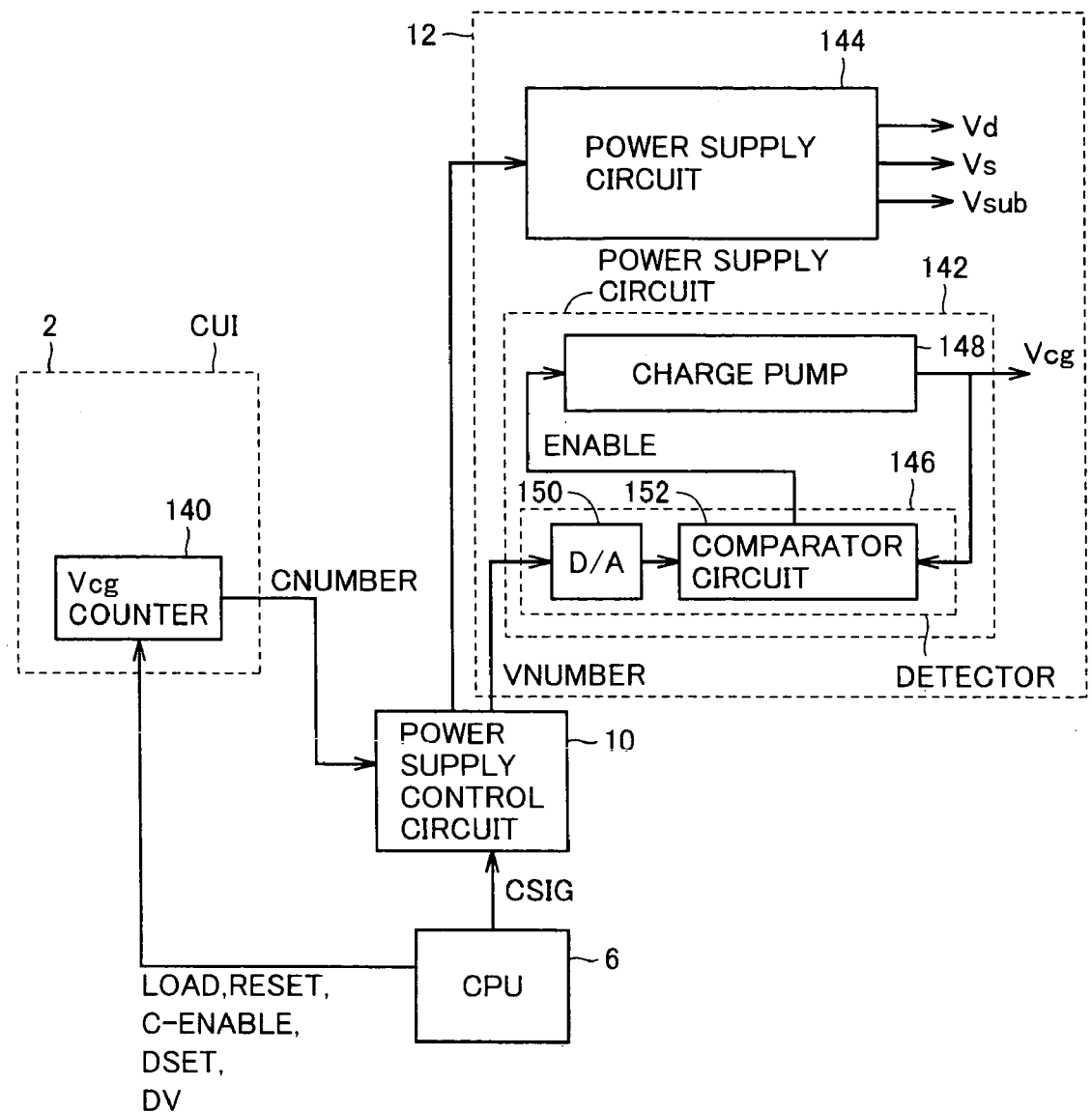
FIG. 18 is a block diagram illustrating a configuration for controlling a control gate potential Vcg in a non-volatile semiconductor memory device in Embodiment 3.

FIG. 18 is a block diagram illustrating a configuration for controlling control gate potential Vcg in the non-volatile semiconductor memory device in Embodiment 3.

Referring to FIG. 18, command user interface (GUI) portion 2 includes a counter 140 generating a setting value CNUMBER for setting potential Vcg to be provided to the control electrode. CPU 6 outputs to counter 140, a reset signal RESET, an enable signal C-ENABLE, a load signal LOAD for loading an initial value, and a signal DSET indicating an initial value for loading. Power supply control circuit 10 controls power supply circuit 12 based on count value CNUMBER and a control signal CSIG from CPU 6, upon receiving count value CNUMBER from counter 140.

Power supply circuit 12 includes a power supply circuit 142 generating potential Vcg for the control gate, and a power supply circuit 144 outputting a source voltage Vs, a drain voltage Vd and a substrate voltage Vsub. Power supply circuit 142 includes a detector 146 and a charge pump 148. Detector 146 converts a digital value of VNUMBER sent from power supply control circuit 10 by an internal D/A converter circuit 150 to an analog voltage, and a comparator circuit 152 compares the analog voltage with potential Vcg output from charge pump 148. Thus, an enable signal ENABLE controlling the charge pump is generated.

Power supply circuit 144 controls activation/inactivation of potentials Vd, Vs and Vsub based on a timing instructed by power supply control circuit 10.

Figure 19:
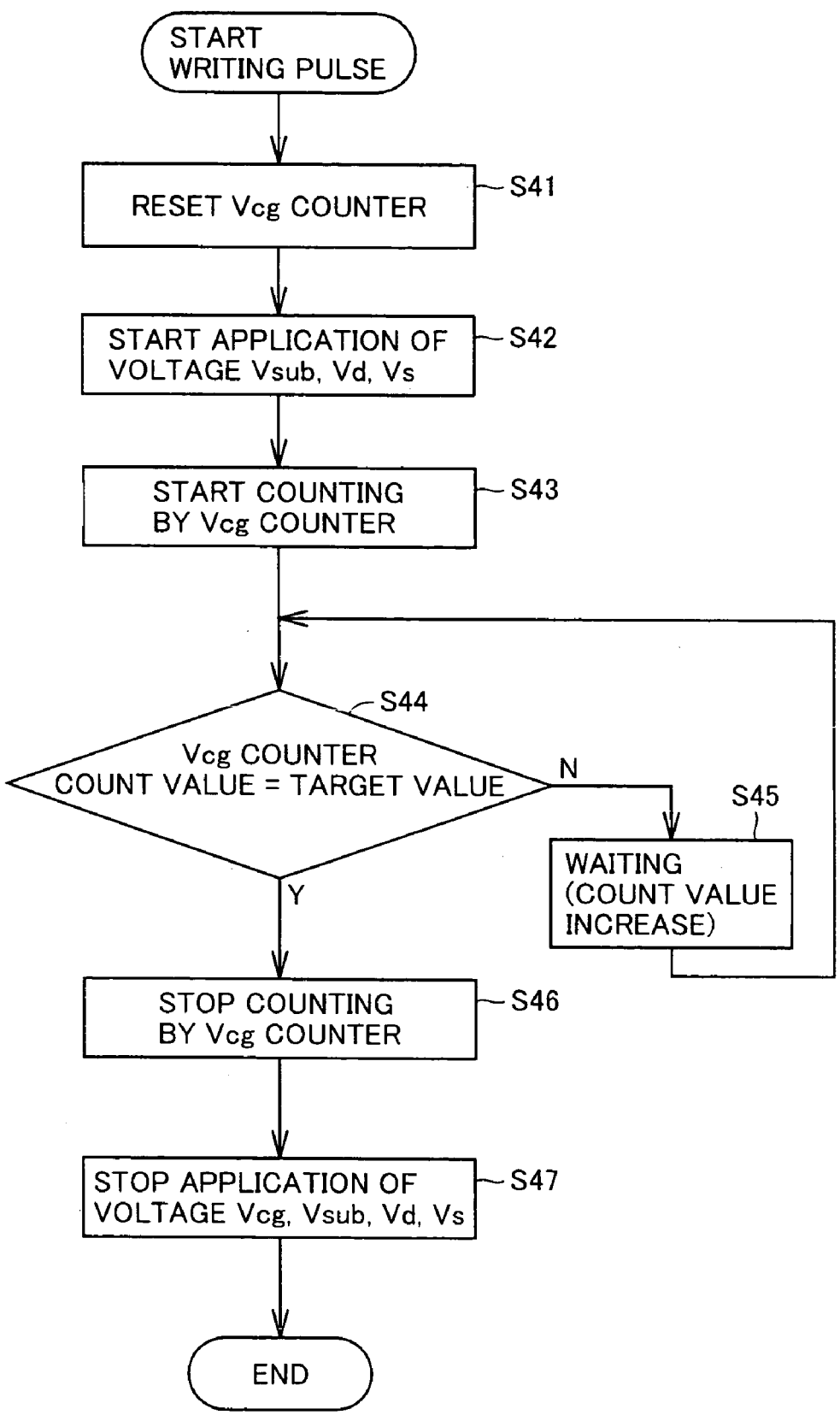
FIG. 19 is a flowchart illustrating a reference example of writing pulse application.

FIG. 19 is a flowchart illustrating a reference example of writing pulse application.

Figure 20:
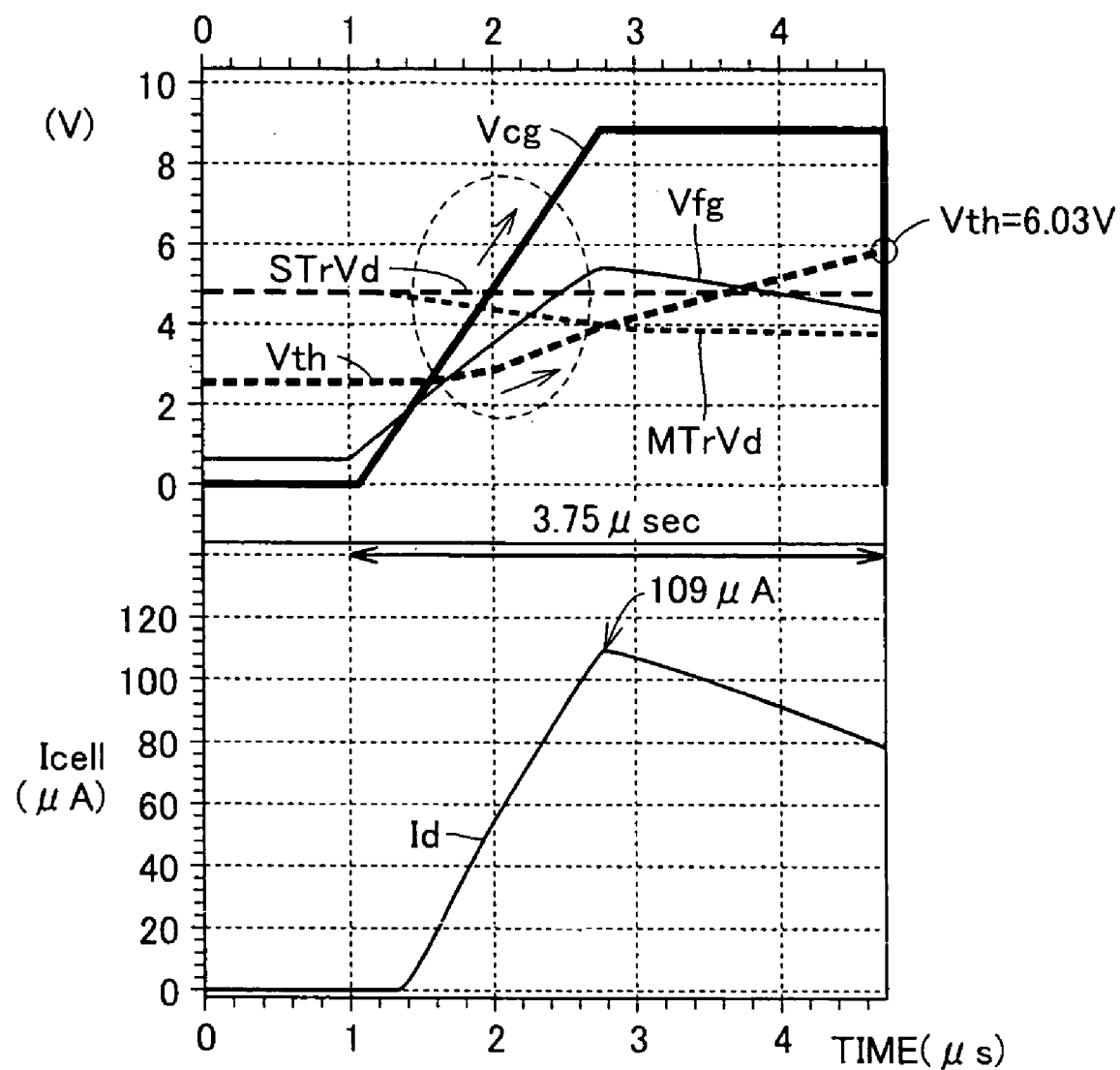
FIG. 20 is an operational waveform diagram showing a waveform exhibited when a voltage is applied in accordance with the flowchart shown in FIG. 19.

FIG. 20 is an operational waveform diagram showing a waveform exhibited when a voltage is applied in accordance with the flowchart shown in FIG. 19.

Referring to FIGS. 19 and 20, when the writing pulse is started, Vcg counter 140 is first reset, and count value CNUMBER is reset to 0 in step S41. Then, in step S42, voltage application of potentials Vsub, Vd and Vs is started. Consequently, around the time from 0 μs to 1 μs in FIG. 20, drain voltage STrVd of the select transistor and drain voltage MTrVd of the memory transistor are both set to 4.8V.

In succession, in step S43, counting by the Vcg counter is started. When CPU 6 activates enable signal C-ENABLE from L level to H level, counter 140 sequentially increments count value CNUMBER based on a not-shown clock signal. In step S44, whether or not the count value of counter 140 has attained the target value is determined. If the target value is attained, the process proceeds to step S45, and increment of the count value is further continued. If it is determined that the count value has attained the target value in step S44, the process proceeds to step S46, in which Vcg counter 140 stops counting. In this manner, as can be seen from the time around 1 μs to the time before 3 μs in FIG. 20, potential Vcg gradually increases, and stops increasing around 9V.

Around time 4.75 μs in FIG. 20, the CPU instructs stop of voltage application in step S47. In this example, a peak current value of drain current Id in FIG. 20 is set to 109 μA. While drain current id is at the peak value, potential MTrVD of the drain of the memory transistor dropped from potential STrVd of the drain of the select transistor becomes the lowest.

Figure 21:
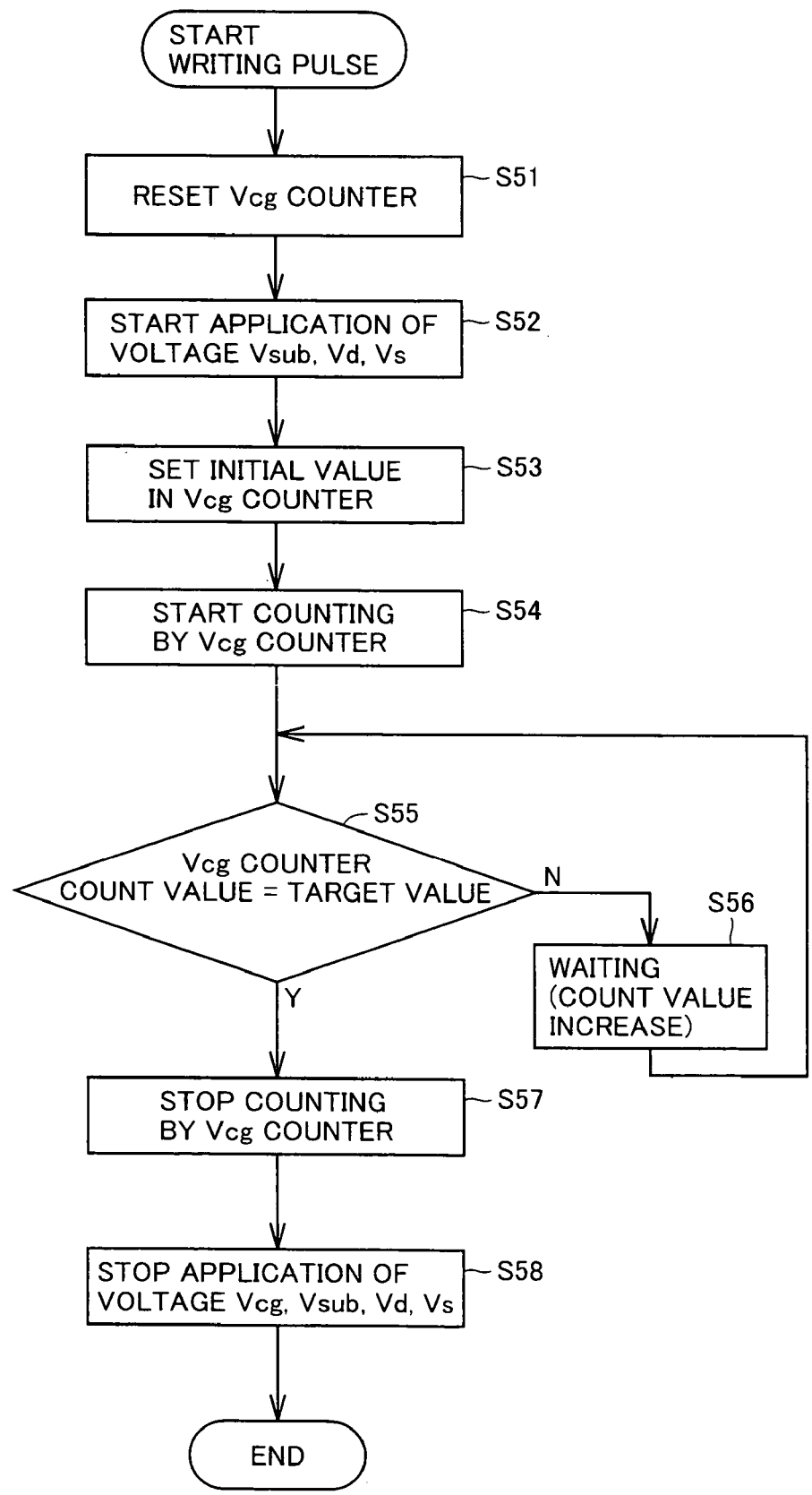
FIG. 21 is a flowchart showing a flow of control of a writing pulse used in the non-volatile semiconductor memory device in Embodiment 3.

FIG. 21 is a flowchart showing a flow of control of a writing pulse used in the non-volatile semiconductor memory device in Embodiment 3.

Figure 22:
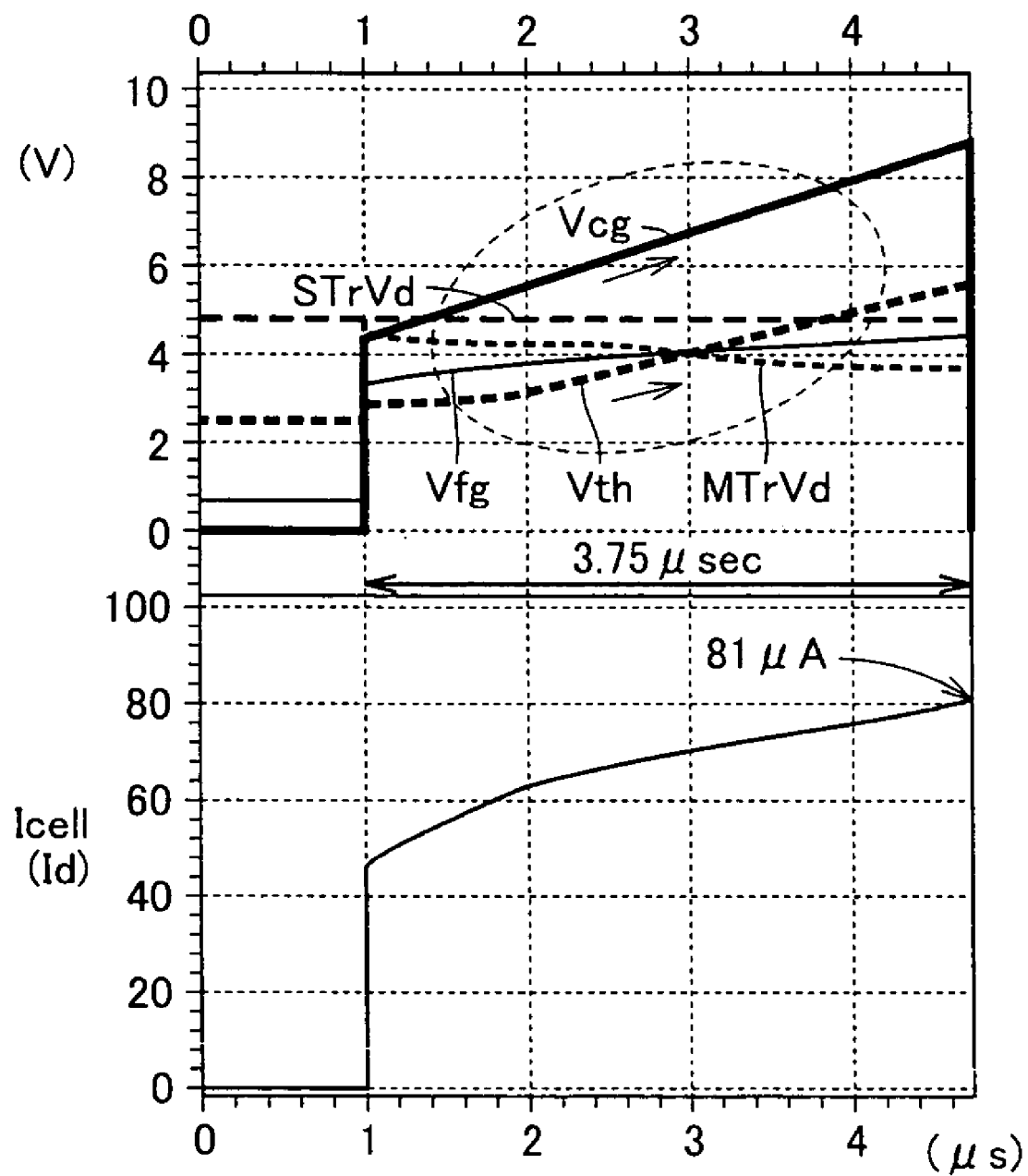
FIG. 22 is an operational waveform diagram illustrating an operation when the flowchart shown in FIG. 21 is used.

FIG. 22 is an operational waveform diagram illustrating an operation when the flowchart shown in FIG. 21 is used.

Referring to FIGS. 21 and 22, when an operation for applying the writing pulse is initially started, Vcg counter 140 is reset in step S51, and application of potentials Vsub, Vd and Vs is started in step S52. Then, during a time from 0 µs to 1 µs in FIG. 22, potential Vcg is set to 0V and potentials STrVd and MTrVd are both set to 4.8V.

In succession, an initial value is set in Vcg counter 140 in step S53. Then, control gate potential Vcg is pulled up at time 1 µs, and drain current Id flows in such an amount as not exceeding a prescribed maximum current Idmax. Here, even if control gate potential Vcg is the same, the value for drain current Id at the time of start of the control operation becomes larger, as the temperature becomes lower in qualitative sense and as the initial threshold voltage is lower. In the example illustrated in FIG. 22, based on such a characteristic, the initial value for control potential Vcg at the time of start of the control operation is set to 4.5V, instead of 0V in the example shown in FIG. 20.

After the initial value is set in step S53, the process proceeds to step S54, in which counting by Vcg counter starts. Counting is started by activation of enable signal C-ENABLE by CPU 6. Here, CPU 6 modifies a control signal DV indicating an increment value per 1 clock of the counter, so as to vary the gradient of potential Vcg from the example shown in FIG. 20.

In FIG. 20, the gradient of applied potential Vcg is steep with respect to a behavior of the threshold voltage of the memory transistor. Here, as high potential Vcg is applied to the control gate in spite of a low threshold voltage, drain current Id flows in a larger amount. In contrast, in the example shown in FIG. 22, the gradient of change in potential Vcg is made gentler in accordance with the behavior of the threshold voltage of the memory transistor. When the gradient of potential Vcg is closer to the behavior (gradient) of the threshold voltage, channel hot electrons can be injected to the floating gate substantially equally at the time of start of the control operation, during the control operation, and at the end of the control operation, while suppressing sudden increase in drain current Id.

After counting by the counter is started, whether or not the count value of the counter has attained the target value is determined in step S55. If the target value has not been attained, the count value is increased in step S56. If the count value has attained the target value in step S55, the process proceeds to step S57, in which counting by the counter is stopped. In step S58, application of potentials Vcg, Vsub, Vd, and Vs is stopped.

Even with the same method of controlling the threshold voltage (hot electron injection in this example), if a plurality of memory transistors are to be controlled, there is a difference in change of the threshold voltage within a range of variation. Even after the same voltage is applied for the same period of time, if there are a plurality of memory transistors, variation is caused depending on the number of the memory transistors, in such an element as storage of electrons in the floating gate, the floating gate potential, the threshold value of the memory transistor, and the like.

For example, when potential Vcg as high as Vcg for other memory transistors is applied to the memory transistor having relatively small storage of electrons in the floating gate (lower threshold voltage), the drain current flows more than necessary. Therefore, efficiency in generating channel hot electrons is lowered, and the threshold value is not raised as efficiently as in other memory transistors.

Figure 23:
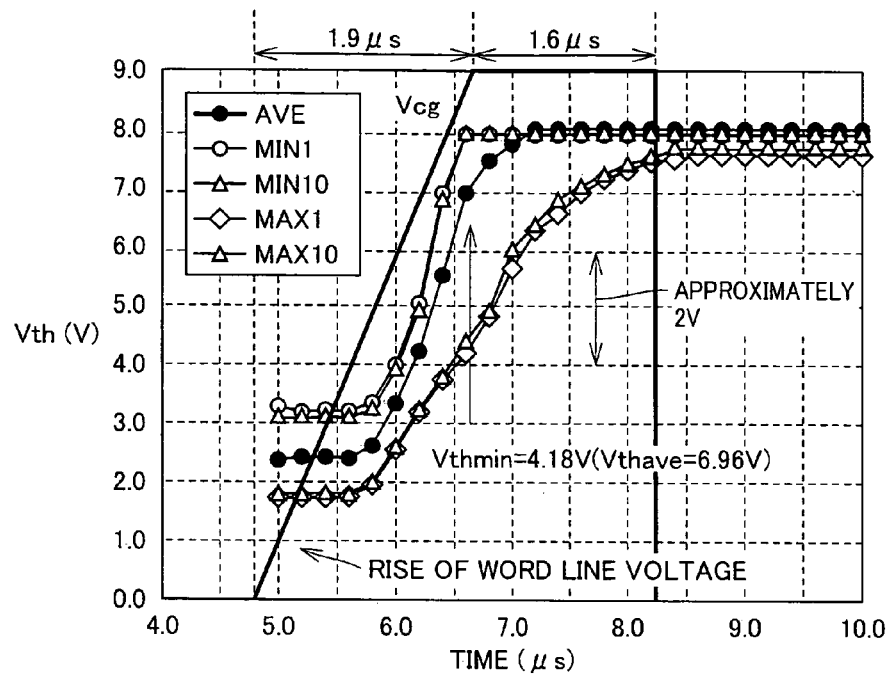
FIG. 23 is a diagram illustrating variation in change of the threshold voltage when the waveform shown in FIG. 20 is applied.

FIG. 23 is a diagram illustrating variation in change of the threshold voltage when the waveform shown in FIG. 20 is applied.

Figure 24:
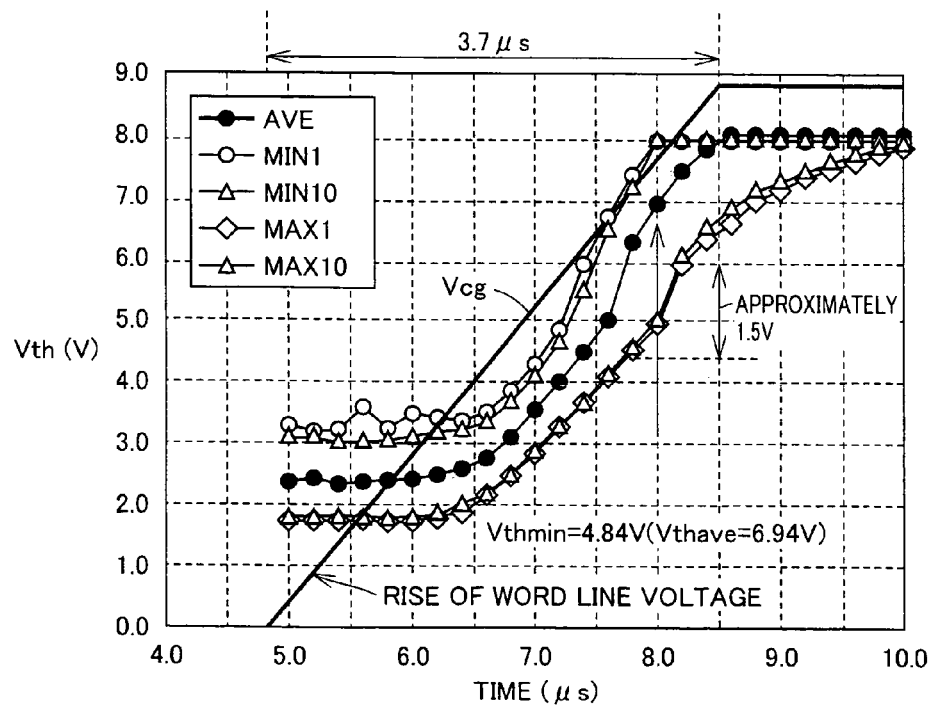
FIG. 24 is a diagram illustrating variation in change of the threshold voltage when the waveform shown in FIG. 22 is applied.

FIG. 24 is a diagram illustrating variation in change of the threshold voltage when the waveform shown in FIG. 22 is applied.

In FIGS. 23 and 24; change in the threshold voltage of 500K memory transistors is shown respectively.

Between FIGS. 23 and 24, there is a difference observed among memory transistors in their threshold voltages (the ordinate in the figure) for the same control time (the abscissa in the figure). If increase in potential Vcg is gentle, the absolute value for Vcg higher than necessary at the time point when storage of electrons in the floating gate is not sufficient can be avoided, and such a phenomenon as a flow of too large drain current can relatively be suppressed.

In FIG. 23, when the threshold voltage of the memory transistor exhibiting normal change attains 6V (around time 6.4 µs), the threshold value of the memory transistor experiencing slowest change has attained approximately 4V. That is, the difference between the threshold values of the two memory transistors is approximately 2V.

In contrast, in FIG. 24, change of control gate potential Vcg has been made gentler, and the difference between the threshold values of the memory transistors can be narrowed to approximately 1.5V (around time 7.8 µs).

As shown above, the value shown in FIG. 24 is approximately 1.5V with respect to approximately 2V shown in FIG. 23, and accordingly, variation has effectively been suppressed.

In this manner, as a ramp waveform can be applied in Embodiment 3, efficiency in writing can be improved. That is, the gradient of control gate potential Vcg is made gentler so as to effectively suppress variation in change of the threshold voltage, resulting in more stable operation for controlling the threshold voltage.

In addition, in Embodiment 3, initially, the voltage is set in the substrate, the drain and the source, and thereafter, the voltage is applied to the control gate. In this manner, the electrons can be generated in advance in the drain of the channel region, and efficient hot electron injection can effectively be performed.

As described above, in Embodiment 3, variation in change of the threshold value among a plurality of memory transistors is suppressed, thereby achieving specifications for a product with a stable writing time. In addition, it is essential to narrow a distribution range of the threshold value in multi-level programming, and the present embodiment is effective therefor.

Embodiment 4

In Embodiment 4, a method of programming a lock bit will be described.

Figure 25:
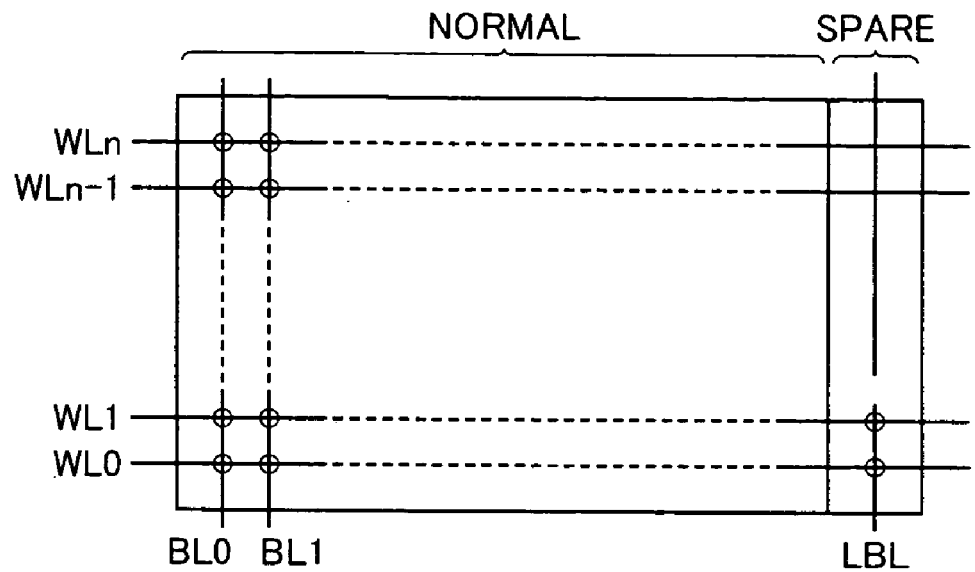
FIG. 25 illustrates a lock bit.

FIG. 25 illustrates a lock bit.

The lock bit refers to a bit present in the memory array for determining whether or not an internal operation may be performed on each memory block. In FIG. 25, a normal memory transistor is arranged at each intersection of word lines WL0 to WLn and bit lines BL0, BL1, . . . in a normal region. In the normal region, one memory transistor stores one-bit information. In contrast, a lock bit uses memory transistors arranged at two intersections of a lock bit line LBL and word lines WL1, WL0 in a spare region adjacent to the normal region, so as to hold 1 bit. In this manner, as the lock bit stores 1 bit using two memory transistors, programming of the lock bit should be performed by simultaneously programming two memory transistors.

Figure 26:
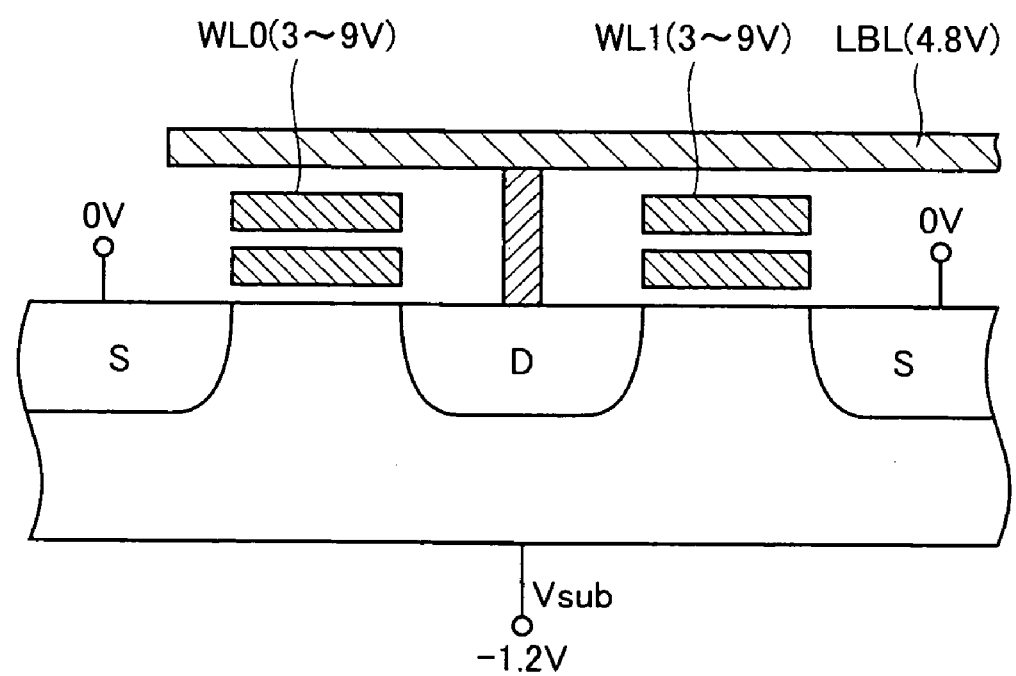
FIG. 26 is a cross sectional view of two memory transistors holding a lock bit.

FIG. 26 is a cross sectional view of two memory transistors holding the lock bit.

Referring to FIG. 26, two memory transistors are present at two intersections of lock bit line LBL and word lines WL1, WL0, and the two memory transistors hold a lock bit.

In order to program the lock bit, for example, the source is set to 0V, the substrate is set to −1.2V, the potential of lock bit line LBL is set to 4.8V, and the potentials of word lines WL0 and WL1 are set to 3 to 9V. Then, channel hot electrons are generated simultaneously in two memory transistors, so as to vary the threshold voltage.

On the other hand, if two cells are simultaneously programmed, the drain current flowing from the lock bit line to the source is doubled as compared with programming a normal memory transistor arranged in the normal region. Therefore, in programming with a trapezoidal wave as described in connection with FIG. 22 in Embodiment 3, the drain current excessively flows, and the capability of the charge pump integrated in the power supply circuit is insufficient, resulting in failure in achieving a stable operation.

Therefore, in Embodiment 4, when a command to program the lock bit is input, CPU 6 determines whether or not a lock bit is to be programmed, and a rate of increase in the potential of the trapezoidal wave is reduced to half.

Figure 27:
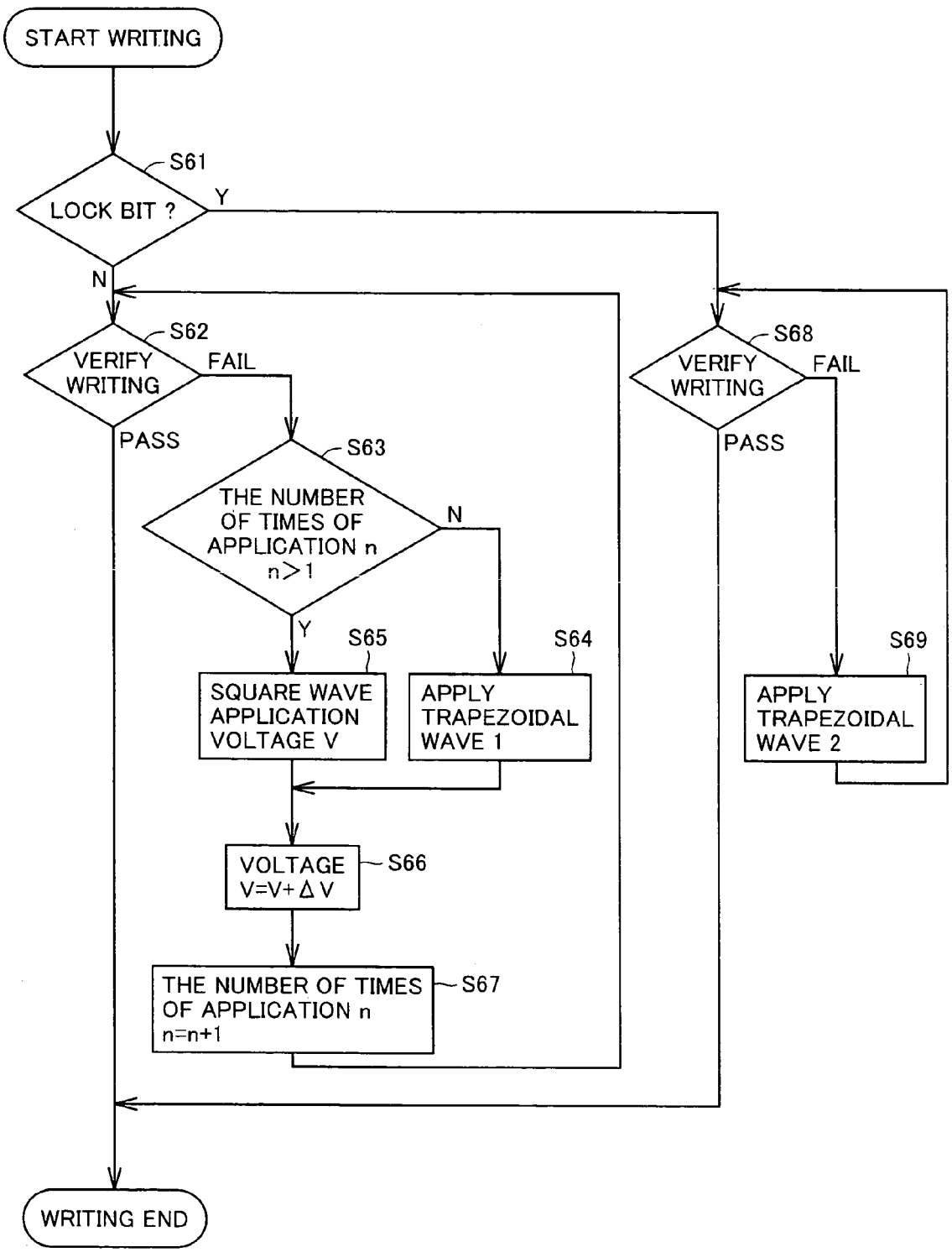
FIG. 27 is a flowchart illustrating an operation to program the lock bit in Embodiment 4.

FIG. 27 is a flowchart illustrating an operation to program the lock bit in Embodiment 4.

Referring to FIG. 27, when the command is input and a writing operation is started, whether or not a designated bit is a lock bit is determined in step S61.

If it is determined that the designated bit is a normal bit in step S61, initially, writing verify is performed in step S62. Then in step S63, whether application of the writing pulse has been performed for the first time or later is determined. If application is performed for the first time, the process proceeds to step S64, in which a trapezoidal wave 1 as described in Embodiment 3 is applied.

On the other hand, if it is determined that application of the writing pulse is the second time or later in step S63, a square wave of voltage V is applied in step S65. When step S64 or step S65 is completed, the setting value for the voltage is increased by incrementing counter 140 in FIG. 18, and the number of times of application n is incremented in step S67.

Figure 28:
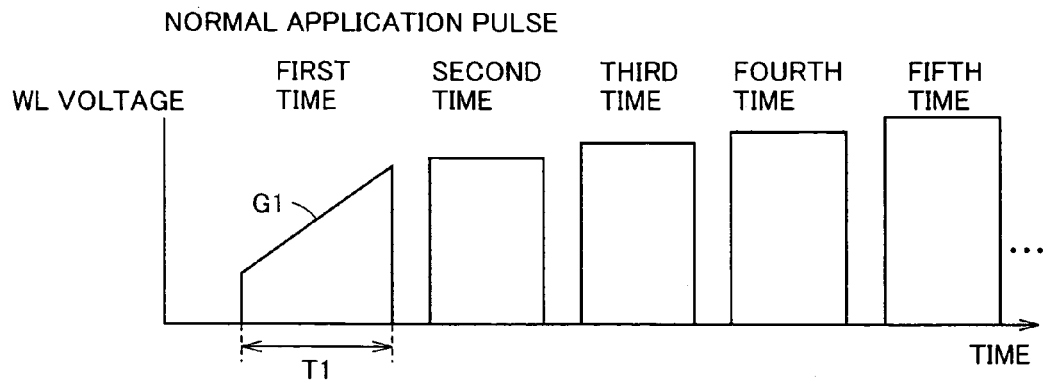
FIG. 28 is an operational waveform diagram illustrating repeated application performed in steps S63 to S67 in FIG. 27.

FIG. 28 is an operational waveform diagram illustrating repeated pulse application performed in steps S63 to S67 in FIG. 27.

As shown in FIG. 28, the trapezoidal wave pulse is applied as the first pulse as described in Embodiment 3. Then, the square wave pulse is repeatedly applied for the second time and later with its voltage value increased every time.

Referring again to FIG. 27, if the designated bit is determined as the lock bit in step S61, the process proceeds to step S68, in which writing verify is initially performed. If determination as failure is made as a result of writing verify, the process proceeds to step S69, in which a trapezoidal wave 2 is applied.

Figure 29:
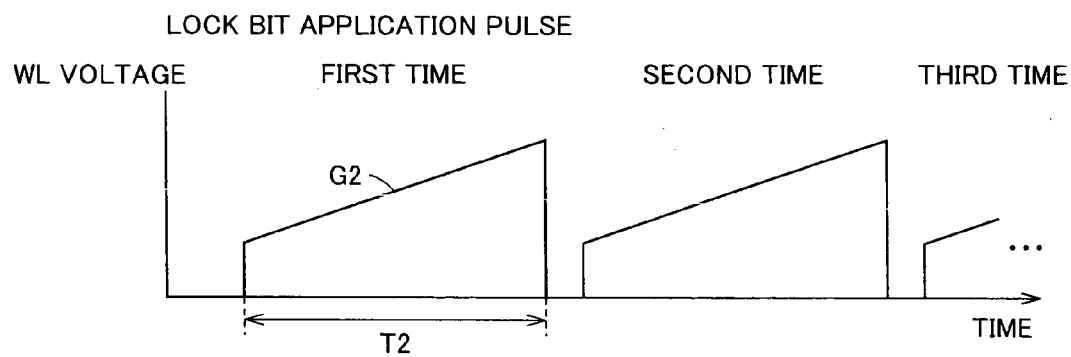
FIG. 29 is a waveform diagram illustrating a manner of application of a trapezoidal wave 2 in step S69.

FIG. 29 is a waveform diagram illustrating application of trapezoidal wave 2 in step S69.

In FIG. 29, if CPU 6 determines the designated bit as the lock bit, increment value DV indicating a count increase value per 1 clock for counter 140 in FIG. 18 is varied, so as to reduce the rate of increase in the voltage of the trapezoidal wave to half, as compared with the normal application pulse shown in FIG. 28. In other words, steepness of a gradient G2 in FIG. 29 is reduced to half, as compared with steepness of a gradient G1 in FIG. 28. In addition, a time period for application of 1 pulse is increased from T1 to T2. In this manner, the same trapezoidal wave is repeatedly applied until the determination as pass is made as a result of writing verify in step S68.

The trapezoidal wave is repeatedly applied because it is assumed that, if the threshold voltage of the lock bit did not reach a program region with the first trapezoidal wave, the threshold voltage may not be shifted by the square wave employed for second application or later as in a normal example. This is because, if the drain current excessively flows, a sufficient voltage is not applied to the drain of the memory transistor.

Therefore, in Embodiment 4, the same trapezoidal wave is also used for the lock bit pulse for second application or later, so as to ensure shift of the threshold voltage. In Embodiment 4, a manner of application of the writing pulse is modified depending on whether the designated bit is the lock bit or not. Accordingly, efficient writing to the lock bit using a plurality of memory transistors can be performed.

Embodiment 5

In Embodiment 5, an ACC (accelerated) mode programming will be described. The ACC mode refers to a mode in which high-speed writing is performed on the premise that data in the memory cell array of the non-volatile semiconductor memory device has completely been erased. For example, the ACC mode is used when a manufacturer that has purchased a non-volatile semiconductor memory device successively writes a program for mass production in a large number of devices using a writing apparatus.

Figure 30:
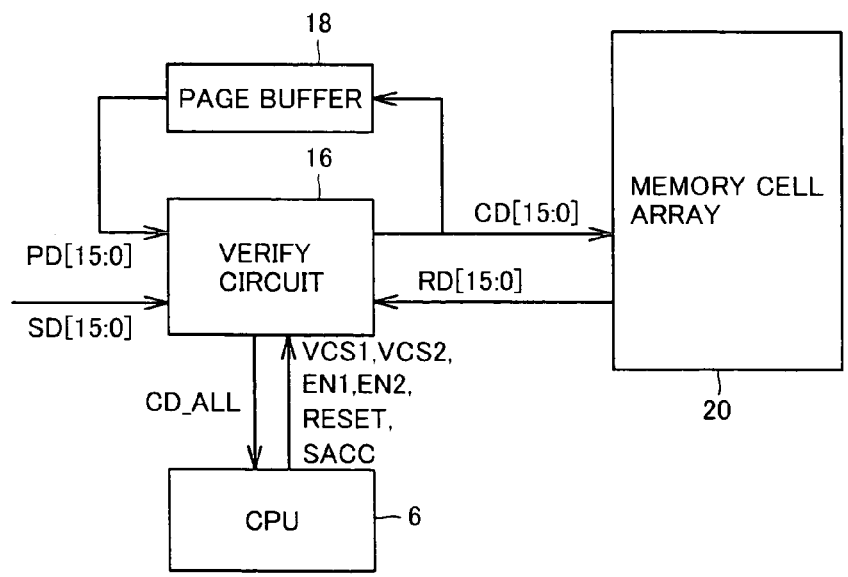
FIG. 30 is a block diagram illustrating a configuration associated with an ACC mode.

FIG. 30 is a block diagram illustrating a configuration associated with the ACC mode.

Referring to FIG. 30, when data is written in memory cell array 20, initially, write data SD[15:0] passes through verify circuit 16 and is written in page buffer 18.

Thereafter, verify circuit 16 compares an output PD[15:0] from page buffer 18 with data RD[15:0] read from memory cell array 20. Verify circuit 16 outputs a signal CD_ALL indicating completion of writing to CPU 6 when determination as pass is made as a result of verify. If determination as failure is made as a result of verify, verify circuit 16 sets a bit requiring application of the writing pulse to "0", sets a bit not requiring application of the writing pulse to "1", and outputs a signal CD[15:0]. In accordance with this result, the writing pulse is applied to memory cell array 20. This value is simultaneously held in page buffer 18, and serves as an expected value PD[15:0] for next comparison in verify circuit 16.

In the normal writing operation as above, as the verify operation is initially performed, the time period for writing is long. If it is known that the data in memory cell array 20 has been erased, however, the first verify operation can be omitted. Here, it is necessary to transmit the write data externally input and held as it is in the page buffer directly to the memory cell array. In order to achieve this, initially, signal PD[15:0] should be reflected on signal CD[15:0] output by verify circuit 16.

Accordingly, verify circuit 16 differently operates, for each operation mode, in accordance with various control signals output from CPU 6 such as VCS1, VCS2, EN1, EN2, RESET, and SACC.

Figure 31:
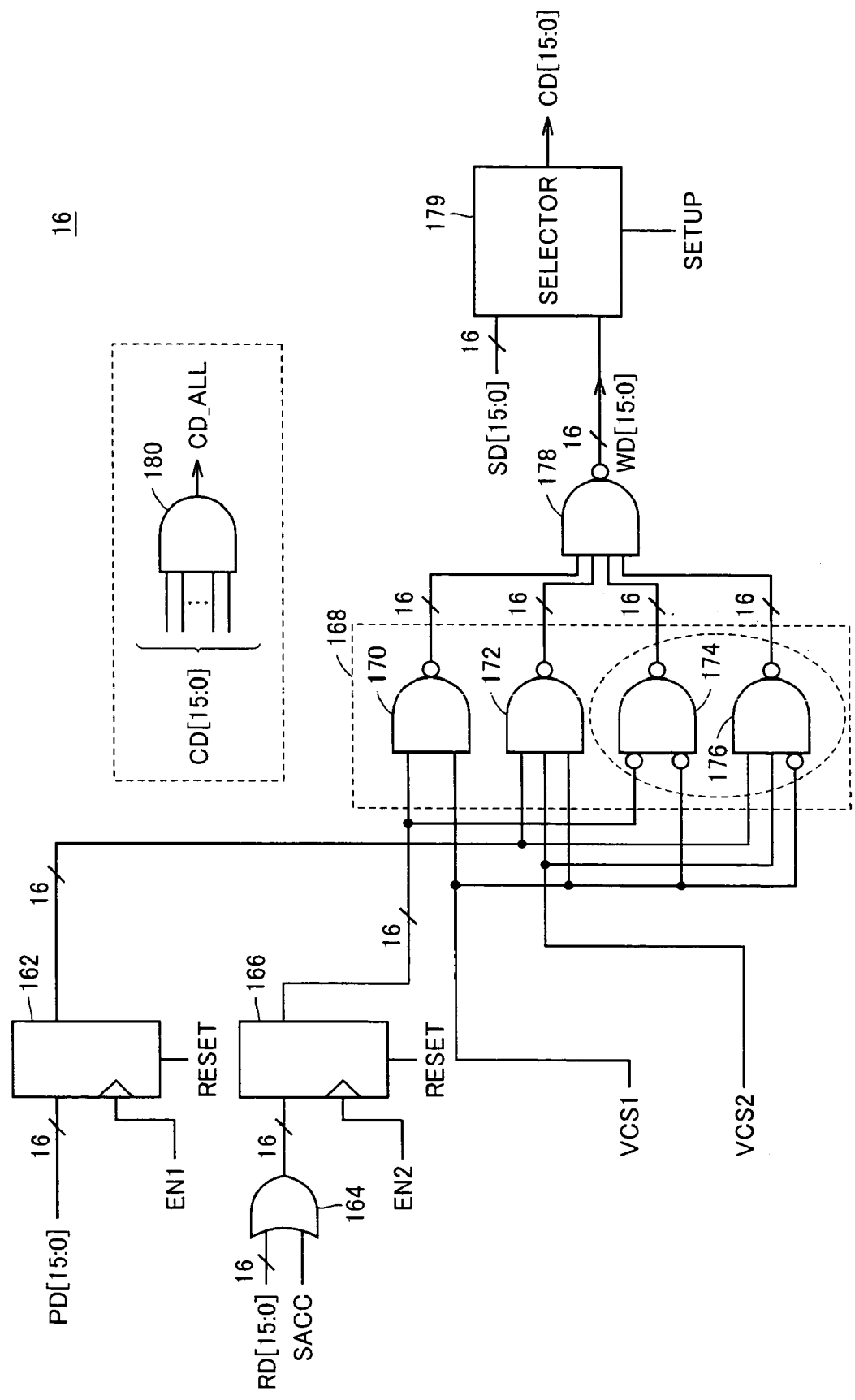
FIG. 31 is a circuit diagram showing a configuration associated with a programming operation of a verify circuit 16 in FIG. 30.

FIG. 31 is a circuit diagram showing a configuration associated with a programming operation of verify circuit 16 in FIG. 30.

Referring to FIG. 31, verify circuit 16 includes a latch circuit 162 taking in data PD[15:0] from the page buffer in response to an enable signal EN1 and having an output reset to "0" in response to reset signal RESET, an OR circuit 164 fixing data RD[15:0] read from the memory cell array to "1" in response to signal SACC activated in the ACC mode, and a latch circuit 166 taking in an output from OR circuit 164 in response to an enable signal EN2 and having an output reset to "0" in response to reset signal RESET.

Verify circuit 16 further includes a gate circuit 168 processing an output from latch circuit 162 and an output from latch circuit 166 in response to signals VCS1 and VCS2.

Gate circuit 168 includes an NAND circuit 170 receiving the output from latch circuit 166 and control signal VCS1, an NAND circuit 172 receiving the output from latch circuit 162 and control signals VCS2 and VCS1, an OR circuit 174 receiving the output from latch circuit 166 and control signal VCS1, and a gate 176 receiving the output from latch circuit 162 and control signals VCS1 and VCS2. Gate 176 outputs L level only when the output from latch circuit 162 and control signal VCS2 attain H level and control signal VCS1 attains L level, and otherwise gate 176 outputs H level.

Verify circuit 16 further includes a 4-input NAND circuit 178 outputting data WD[15:0] upon receiving an output from NAND circuit 170, an output from NAND circuit 172, an output from OR circuit 174, and an output from gate 176; a selector 179 selecting either one of data WD[15:0] or write data SD[15:0] externally input along with a write command in accordance with a control signal SETUP from command user interface portion 2 and outputting signal CD[15:0]; and an AND circuit 180 performing an operation of all logical multiplication of 16-bit signal CD [15:0] output from selector 179 and outputting signal CD_ALL.

When the write command is input, command user interface portion 2 once activates control signal SETUP, so that write data SD[15:0] is output as CD[15:0], which is in turn held in page buffer 18. Thereafter, command user interface portion 2 inactivates control signal SETUP, and from that time, data WD[ 15:0] reflecting a result of comparison is written as CD[15:0] in page buffer 18.

Verify circuit 16 is used commonly in each mode such as OEV, PV, VLC, EV, Flash to PB, or the like. Therefore, an operation of verify circuit 16 is switched by control signals VCS1 and VCS2.

An OEV (Over Erase Verify) mode refers to a mode in which overerase verify is performed. A PV (Program Verify) mode refers to a mode in which writing verify is performed. A VLC (Vth Lower Check) mode refers to a mode in which lower limit verify is performed after writing to an overerased bit. An EV (Erase Verify) mode refers to a mode in which erase verify is performed. A Flash to PB mode refers to a mode causing verify circuit 16 to operate without performing comparison in order to write the contents in the memory cell into the page buffer utilizing a verify path.

By modifying control signals VCS1 and VCS2, an operation adapted to each mode is performed. In the OEV mode, signals VCS1 and VCS2 are both set to L level. In the PV mode and the VLC mode, signal VCS1 is set to L level while signal VCS2 is set to H level. In the EV mode and the Flash to PB mode, signal VCS1 is set to H level while signal VCS2 is set to L level.

In the ACC mode described in Embodiment 5, control in the PV mode is carried out. Here, the outputs from NAND circuits 170 and 172 are both fixed to H level, and verify determination is made based on a combination of logics of OR circuit 174 and gate 176.

As described previously, in the ACC mode, the first verify is not performed for saving time, and OR circuit 164 is provided for this purpose. In normal programming, latch circuit 162 outputs an expected value externally input at the time of first verify, that is, a write value to be programmed. This output is transmitted through gate 176 to NAND circuit 178. On the other hand, data RD[15:0] read from the memory cell is transmitted through the output of latch circuit 166 and OR circuit 174 to NAND circuit 178.

If the first verify operation is not performed in the ACC mode, data RD[15:0] of the memory cell is not input from the memory cell array, and therefore, latch circuit 166 is in a reset state holding "0". Accordingly, as 16 bits output by OR circuit 174 are all set to "0", 16 bits of signal WD[15:0] output by NAND circuit 179 are all set to "1", and bits of CD[15:0] are also all set to "1".

If the bits of CD[15:0] are all set to "0", the writing pulse is applied to the memory cell. On the other hand, if these bits are set to "1", it is determined that programming has been completed and the pulse is no longer applied. Accordingly, in the ACC mode, signal SACC is activated to H level. By setting the output from OR circuit 174 to H level in this manner, pulse application in accordance with the output from latch circuit 162 can necessarily be performed without first verify.

Figure 32:
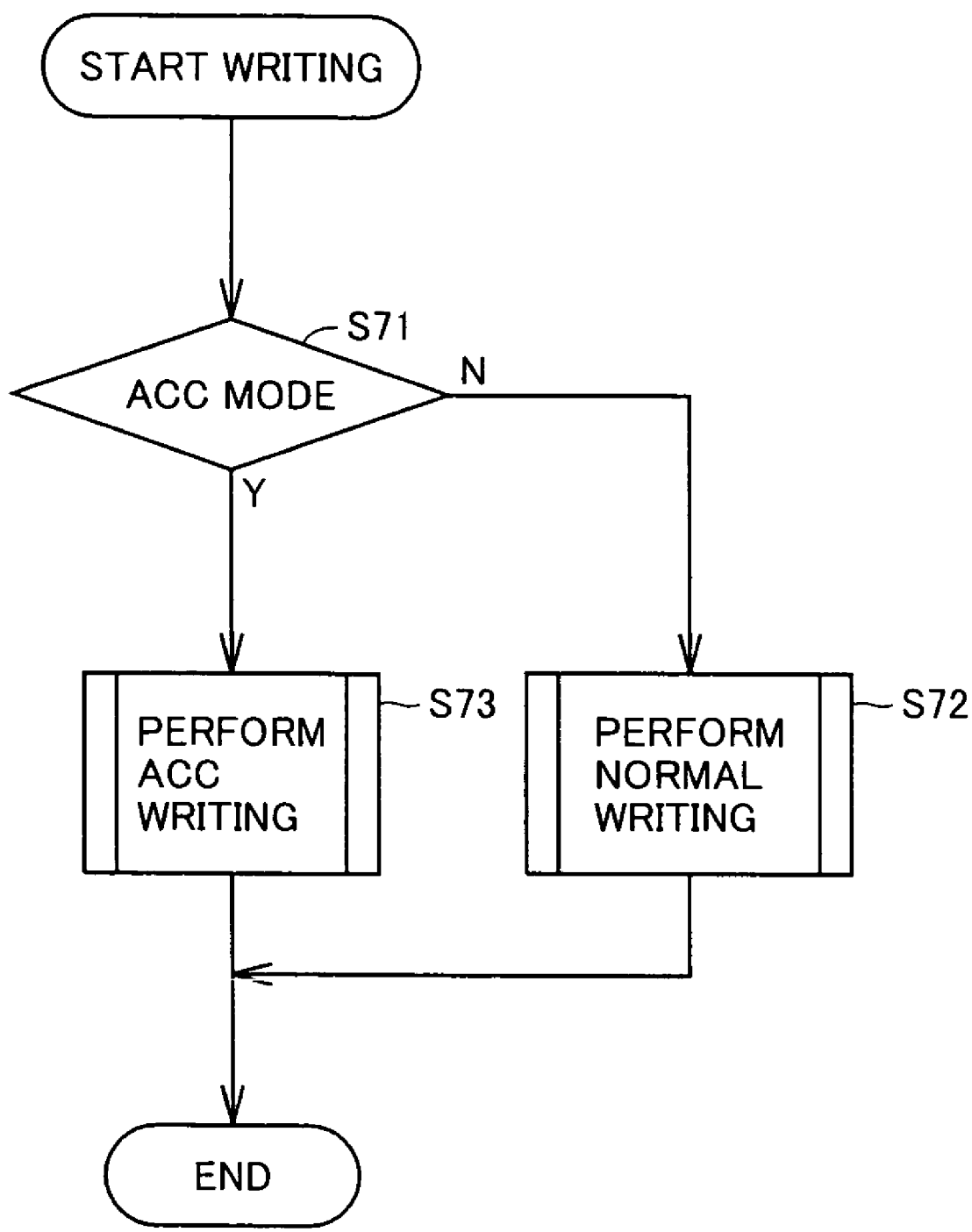
FIG. 32 is a flowchart illustrating a writing operation in Embodiment 5.

FIG. 32 is a flowchart illustrating a writing operation in Embodiment 5.

Referring to FIGS. 30 and 32, when the writing operation is started, initially, CPU 6 determines whether or not the operation mode is set to the ACC mode in step S71. If the operation mode is not set to the ACC mode, the process proceeds to step S72, and normal writing is performed.

On the other hand, if the mode is set to the ACC mode, ACC writing is performed in step S73.

Figure 33:
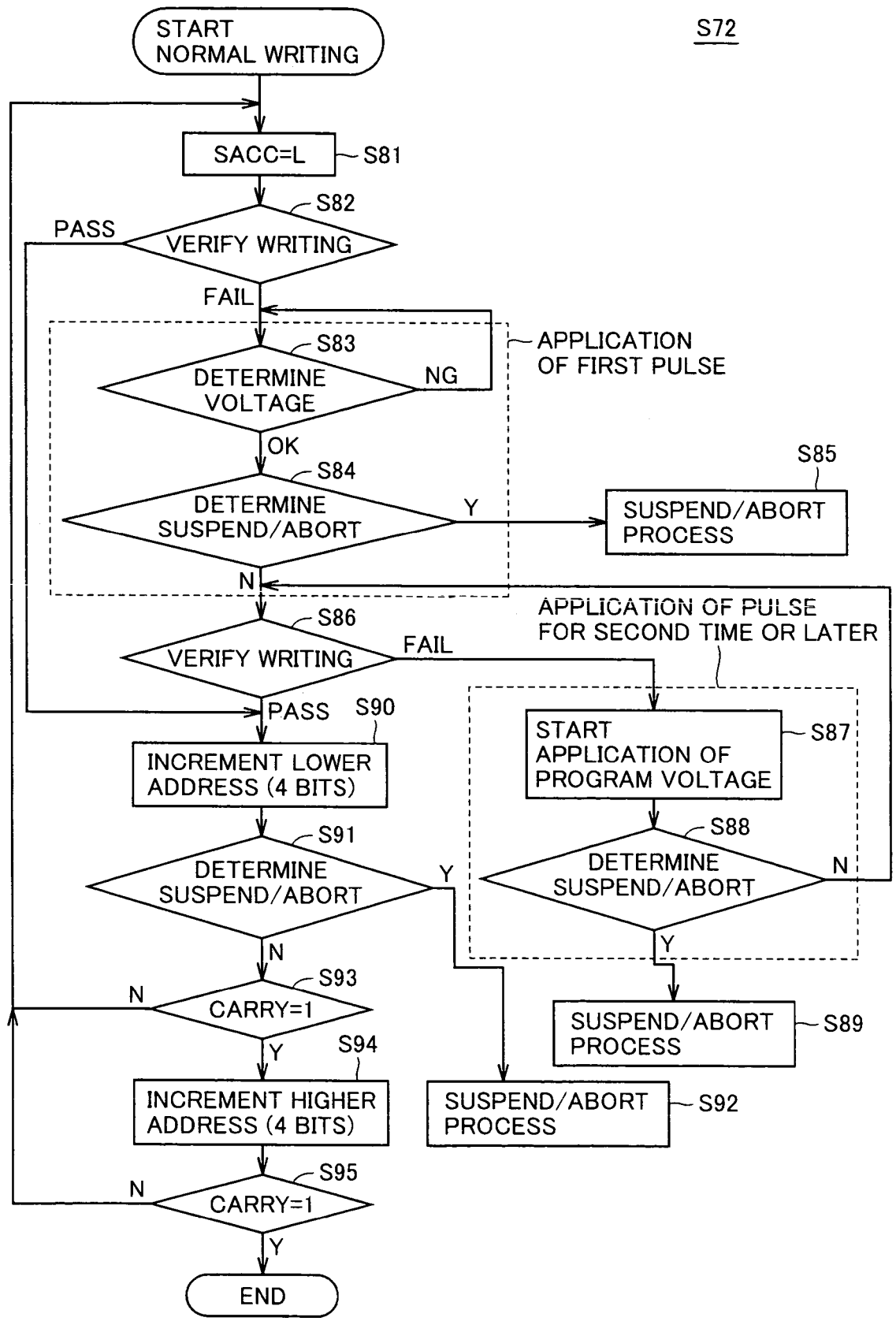
FIG. 33 is a flowchart illustrating, in more detailed manner, step S72 in which normal writing in FIG. 32 is performed.

FIG. 33 is a flowchart illustrating, in more detailed manner, step S72 in which normal writing in FIG. 32 is performed.

Referring to FIGS. 30 and 33, when normal writing is started, CPU 6 sets signal SACC to L level with respect to verify circuit 16 in step S81. Then, writing verify is performed in step S82. If determination as pass is made as a result of writing verify, the process proceeds to step S90. On the other hand, if determination as failure is made as a result of writing verify, the first pulse application operation is performed.

The first pulse application operation is performed in steps S83 and S84.

Figure 34:
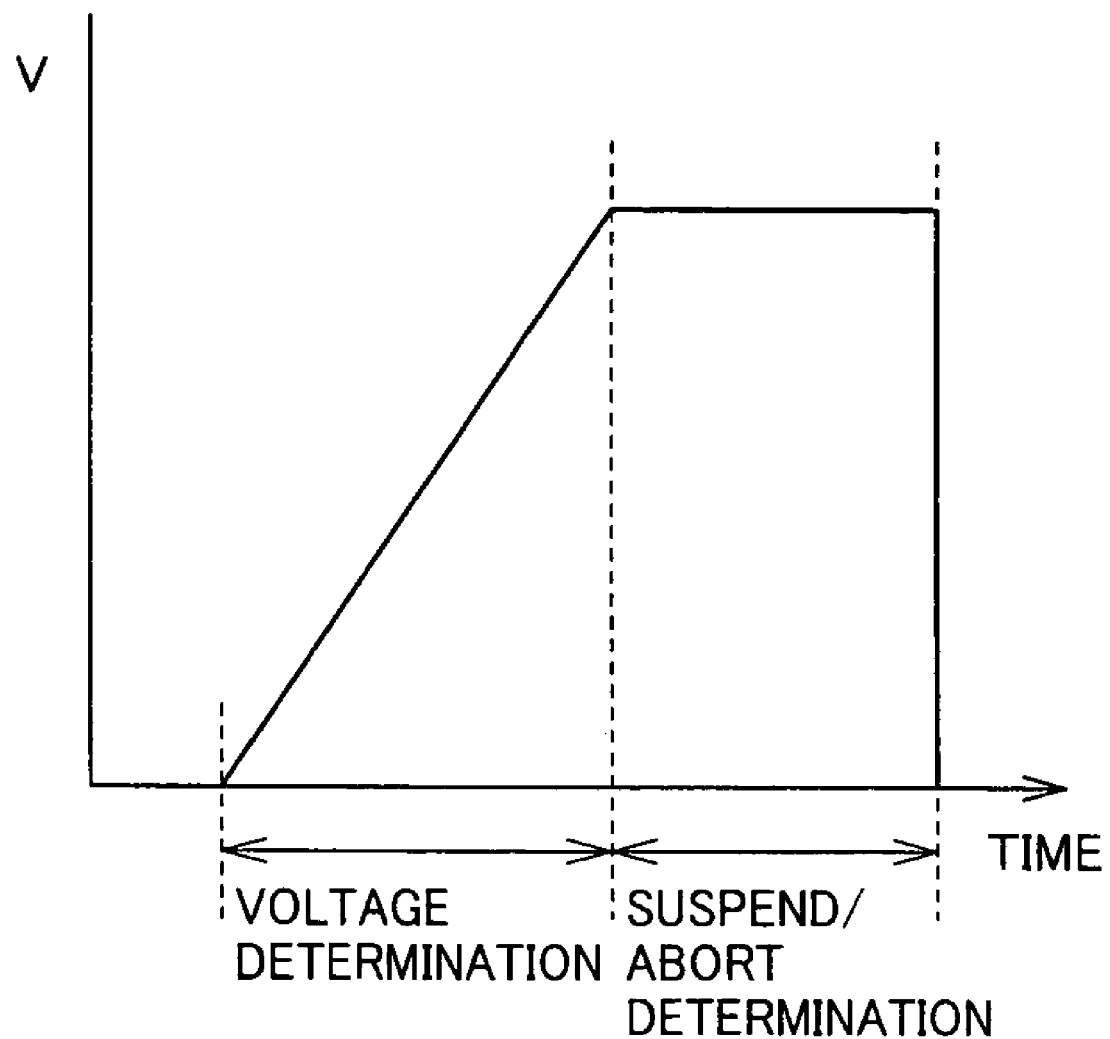
FIG. 34 is a waveform diagram illustrating a waveform when a first pulse is applied.

FIG. 34 is a waveform diagram illustrating a waveform when the first pulse is applied.

Referring to FIGS. 33 and 34, the voltage is raised until the pulse voltage attains a prescribed value in step S83. When the voltage attains the target value, suspend/abort determination is made in step S84. Here, suspend refers to stop of the writing operation if a request for an interrupt handling is externally provided within 15 μs, for example. In addition, an abort process refers to such a process as forced termination of writing when the time for writing exceeds a prescribed value, for example.

When the first pulse application is completed in steps S83 and S84, the process proceeds to step S86, in which writing verify is performed. If determination as failure is made as a result of writing verify, second pulse application is performed.

As to pulse application for the second time or later, initially, application of the program voltage is started in step S87, and successively, suspend/abort determination is made in step S88. If suspend or abort is determined in step S88, the process proceeds to step S89, in which a suspend/abort process is performed. On the other hand, if suspend or abort is not determined in step S88, the process returns to step S86, in which writing verify is performed.

If determination as pass is made as a result of writing verify in step S86, the process proceeds to step S90.

In step S90, lower 4 bits of a write address are incremented, and in step S91, suspend/abort determination is made. If suspend or abort is determined in step S91, the process proceeds to step S92, in which the suspend/abort process is performed. On the other hand, if determination as suspend and abort is not made in step S91, the process proceeds to step S93, in which whether or not a carry took place as a result of increment of 4-bit address is determined. If the carry indicates "1", the process proceeds to step S94, in which higher 4 bits of the address are incremented. On the other hand, if the carry does not indicate "1" in step S93, the process returns to step S81 in order to perform writing with respect to a next address.

After the higher 4 bits of the address are incremented in step S94, the process proceeds to step S95, in which whether or not a carry took place as a result of increment is determined. If the carry took place, that is, if the carry indicates "1", writing ends. If the carry did not take place, the process returns to step S81 in order to perform writing with respect to a next address.

Figure 35:
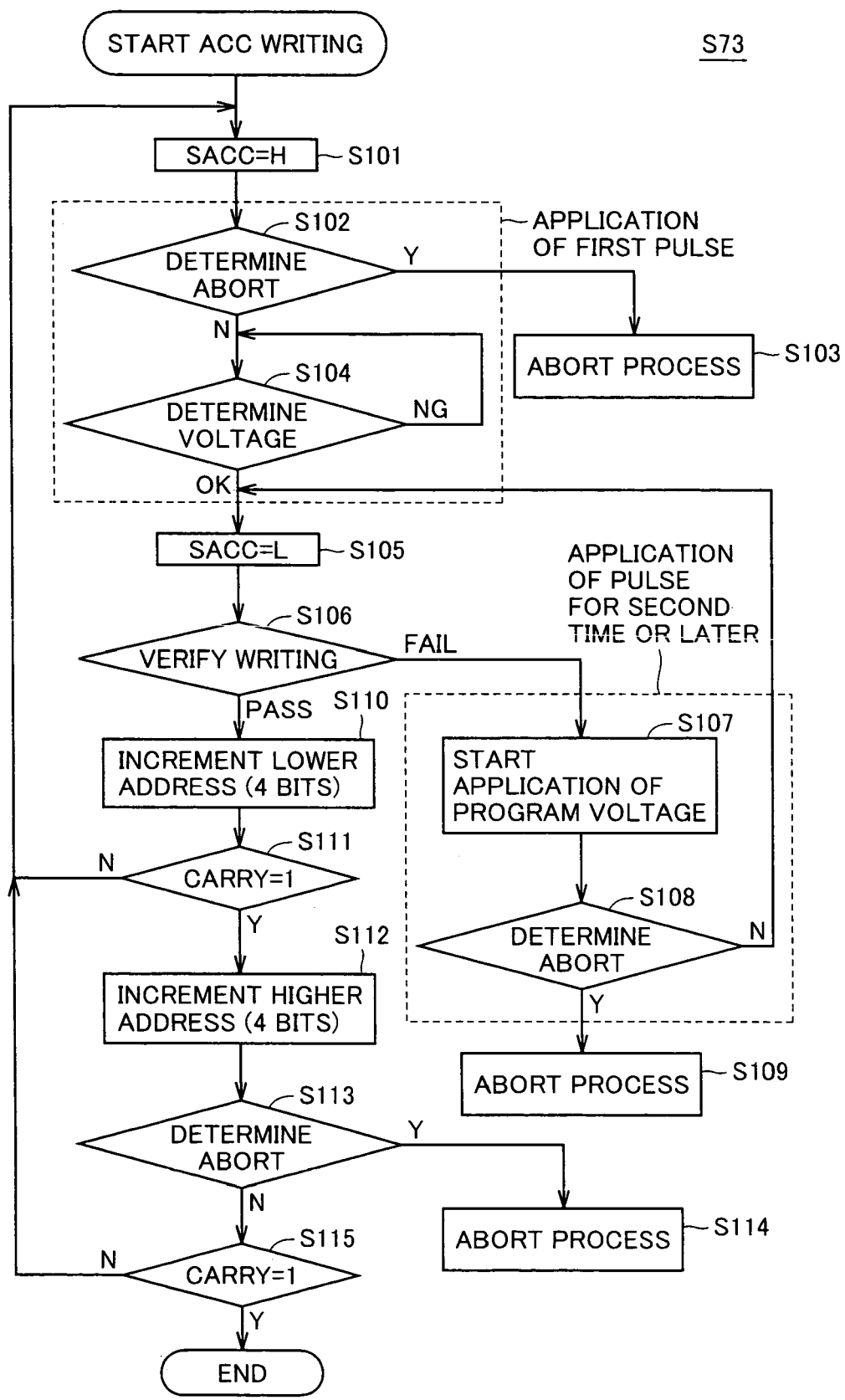
FIG. 35 is a flowchart illustrating a detailed ACC writing operation in step S73 in FIG. 32.

FIG. 35 is a flowchart illustrating a detailed ACC writing operation in step S73 in FIG. 32.

Referring to FIGS. 30 and 35, the ACC writing is considerably different from normal writing shown in FIG. 33 in that first pulse application is performed without performing first writing verify and that determination on the suspend process is not performed.

In the normal writing, a point for suspending an operation even during the internal operation is provided on the program in preparation for an external interrupt request. In order to ensure a process in case of reception of an interrupt request, a margin is provided for a standard value for an interval accepting an external interrupt request. If the standard value for an interval is, for example, 15 µs, an interrupt processing routine is embedded in software stored in an ROM approximately every 10 µs.

The process in FIG. 33 takes long time, because the interrupt processing routine is executed and checking as to whether or not the process is being suspended is performed each time. If writing into a flash memory of which contents have been erased, such as writing during mass production in which an interrupt normally does not take place, is performed, programming is accelerated using a process flow in the ACC mode shown in FIG. 35, from which a suspend point has been eliminated.

If the abort determination routine embedded together with a suspend request determination routine is simultaneously eliminated, however, a problem will arise.

If a memory cell transistor has a poor characteristic and programming operation is not completed within a standard time period, the process should be aborted 10, due to time out. In the normal writing described in connection with FIG. 33, such determination is made in a routine the same as suspend. Therefore, if suspend/abort determination is simply eliminated from the flowchart in FIG. 33, the abort process in the case of time out is no longer possible. In the following, the flowchart in FIG. 35 will sequentially be described.

When ACC writing is started, the CPU sets control signal SACC to H level in step S101. When the write command is input to command user interface portion 2, control signal SETUP is activated and the write data is transferred to page buffer 18. When control signal SETUP is inactivated later, the write data passes through verify circuit 16 and is transmitted to the memory cell array as CD[15:0]. Then, first pulse application is performed without performing a verify operation. At the time of first pulse application, abort determination is made in step S102, and voltage determination is made in step S104.

Figure 36:
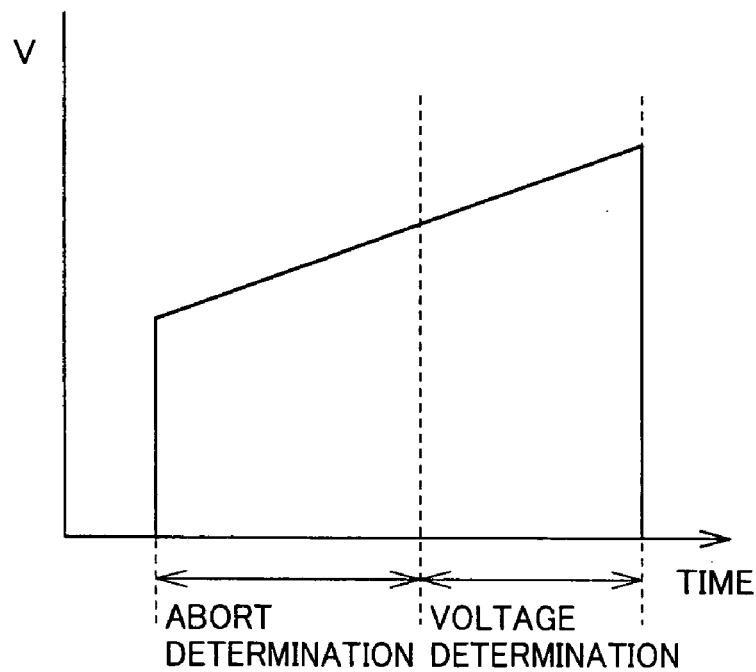
FIG. 36 is a waveform diagram illustrating the first pulse in ACC writing.

FIG. 36 is a waveform diagram illustrating the first pulse in ACC writing.

Referring to FIG. 36, in ACC writing, the trapezoidal wave pulse as described in Embodiment 3 is applied. An initial voltage is applied by initially setting the counter to a prescribed value, and thereafter, voltage determination for determining whether or not the counter has attained the target value is made. Here, as it is clear that the target value is not attained at an initial stage even without observing the count value, abort determination is performed in the first-half of pulse application.

More specifically, as the abort routine has at most 10 codes, the voltage is raised solely by approximately 2V during that period. Therefore, if voltage application is started from 3V, the voltage is merely raised to approximately 5V while the abort routine is being processed. Therefore, it is impossible that the target value (approximately 9V) of the voltage to be attained is exceeded, even without voltage determination by CPU 6 referring to the count value. Though such a waveform in FIG. 34 that the square wave is applied following the trapezoidal wave as the first pulse may be employed for the first pulse in the ACC mode, in such a case, abort determination is made while the square wave following a ramp wave is being applied.

Referring again to FIG. 35, if determination as abort due to time out or the like is made in step S102, the process proceeds to step S103, in which the abort process is performed.

If determination as abort is not made in step S102, the process proceeds to step S104, in which voltage determination is made and the voltage is raised until the target value is attained. When the voltage attains the target value in step S104, the process proceeds to step S105.

In step S105, CPU 6 inactivates signal SACC to L level. Then, verify circuit 16 is set so as to perform normal verify. Thereafter, writing verify is performed in step S106. If determination as failure is made as a result of writing verify, second pulse application or later is performed in steps S107 and S108. In step S107, application of the program voltage is started, and in step S108, abort determination is made.

If determination as abort is made in step S108, the process proceeds to step S109, in which the abort process is performed. On the other hand, if determination as abort is not made in step S108, the process returns to step S105.

If determination as pass is made as a result of writing verify in step S106, writing with respect to a next address is performed.

In page programming, programming of 128 words is performed. Accordingly, an address increment routine is required. As CPU 6 in a flash memory herein is a 4-bit microcomputer capable of processing a 4-bit-width data in response to one command, 16 times of processes at the maximum can be performed like a 4-bit-width counter. In other words, in order to increment an address using the software in the CPU, if lower 4 bits are full, another routine should be used to perform another 3-bit counter operation.

If determination as pass is made in step S106, the process first proceeds to step S110, and lower 4 bits of the write address are incremented.

Then, in step S111, whether or not a carry took place as a result of increment is determined. If it is determined that the carry took place, the process proceeds to step S112, and higher 4 bits of the address are incremented. On the other hand, if it is determined that the carry did not take place, the process returns to step S101, and the writing process with respect to the next address is performed.

If the higher 4 bits of the address are incremented in step S112, successively, abort determination is made in step S113.

An operation of the higher 3 bits is performed only 7 times out of 128 times. Even if the 10-code abort determination routine is added to such an operation routine, the total sum is 10×70 ns=700 ns. Dividing this value by 128 times, the result is merely 5.5 ns per one word, which is negligible.

If determination as abort is made in step S113, the process proceeds to step S114, and the abort process is performed.

On the other hand, if determination as abort is not made in step S113, the process proceeds to step S115, and whether or not a carry took place as a result of increment in step S112 is determined. If the carry did not take place, the process returns to step S101, and the writing process with respect to the address after increment is performed. On the other hand, if it is determined that the carry took place in step S115, the writing process ends.

In Embodiment 5, the ACC mode is provided and writing verify is not performed before application of the first pulse. In addition, the abort determination routine is inserted immediately after the increment process for the higher 3 bits in the process of the address increment. In this manner, extension of the time is avoided, and a write control sequence allowing abort is achieved. In other words, a user-friendly, non-volatile semiconductor memory device with the accelerated writing mode attaining a reduced time period can be implemented.

Embodiment 6

In Embodiment 6, a method of controlling a charge pump in a power supply circuit in block erasing will be described.

Figure 37:
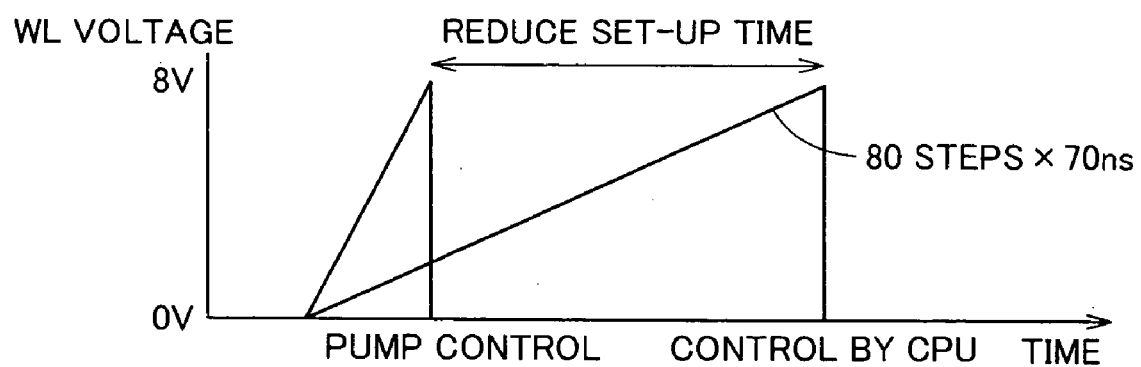
FIG. 37 illustrates a time period for set-up of a charge pump.

FIG. 37 illustrates a set-up time of a charge pump.

Referring to FIG. 37, when the CPU increments the counter from 0 and counts up the target voltage value from 0, a set-up time is extended. In contrast, if the charge pump has sufficient capability, the set-up time can be shortened.

Figure 38:
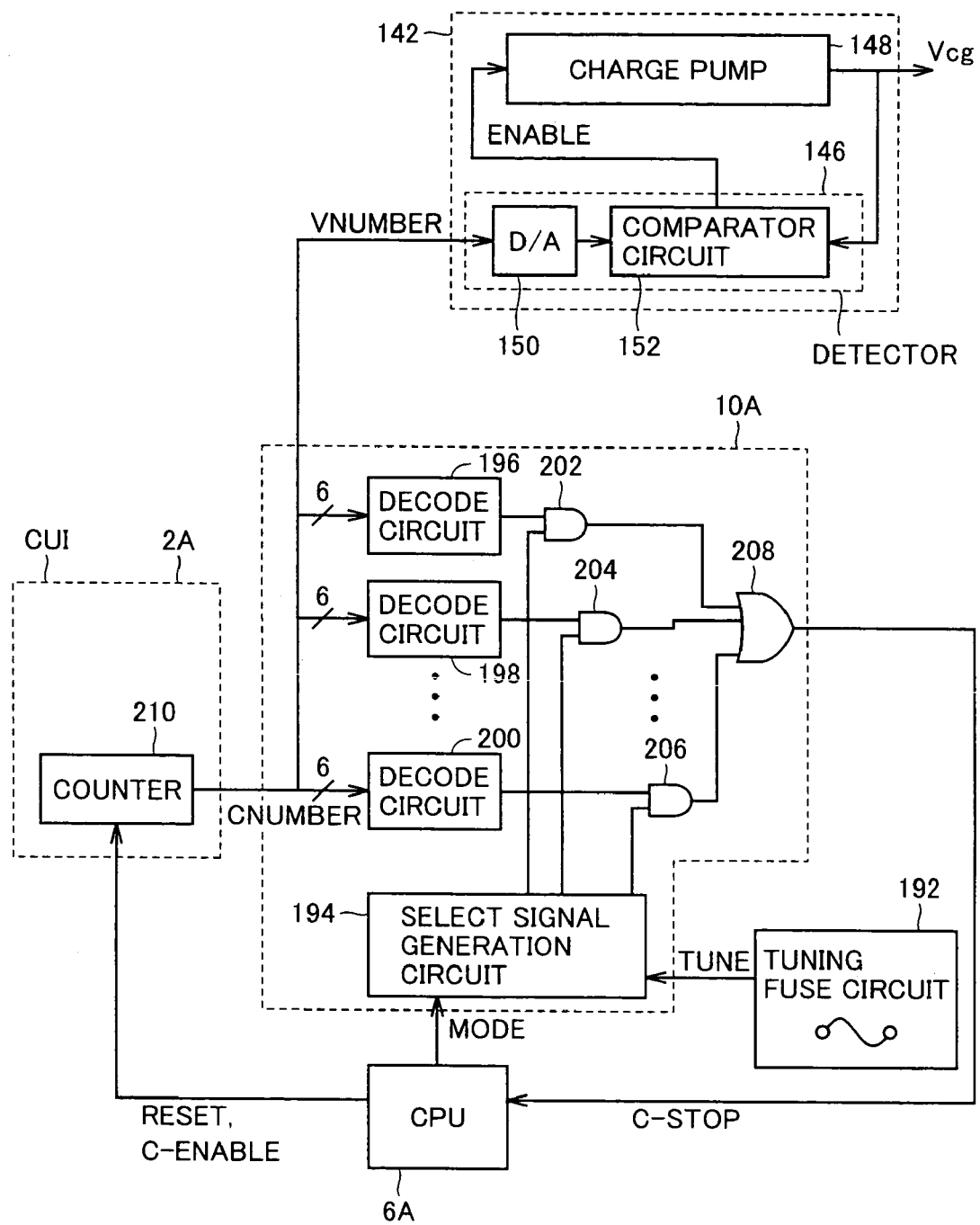
FIG. 38 is a block diagram illustrating a reference example of a method of controlling a charge pump in block erasing.

FIG. 38 is a block diagram illustrating a reference example of a method of controlling the charge pump in block erasing.

Referring to FIG. 38, in this example, a counter 210 in a command user interface portion 2A is adapted not to erasing but to programming. That is, when a reset signal is sent from a CPU 6A, output value CNUMBER of counter 210 is reset to "0". When control signal C-ENABLE output from CPU 6A is activated, counter 210 starts counting, and when it is inactivated, counter 210 stops counting. This is because the counter is designed to produce a triangular wave in programming. Here, the triangular wave is also referred to as a ramp wave, and exhibits a waveform increasing a set voltage from 0V to a set value in a temporal step.

A power supply control circuit 10A outputs a stop signal C-STOP to CPU 6A when the output from counter 210 attains a prescribed value in accordance with an operation mode sent from CPU 6A and a tuning signal set in a tuning fuse circuit 192. Decode circuits 196, 198, . . . , 200 detect a voltage value corresponding to a variety of conditions. A select signal generation circuit 194 selects one of outputs from decode circuits 196 to 200 based on the operation mode and the tuning signal, using AND circuits 202 to 206 and an OR circuit 208.

When the erasing pulse is applied for block erasing, the triangular wave is not particularly required, and instead, application of a pulse of a constant voltage is necessary. In the configuration shown in FIG. 38, until the set target voltage is attained, it is necessary that a voltage control circuit 10A determines the count value and CPU 6A controls enable signal C-ENABLE in accordance with signal C-STOP output from the voltage control circuit so as to operate counter 210.

For example, when a voltage of 8V is necessary and Vcg is raised from 0 to 8V in a step of 0.1V/70 ns, a set-up time of 80 times×70 ns=5.6 μs is necessary. If such a process is performed for each set of voltages, it is considerably time-consuming. In addition, as it is also necessary to notify CPU 6A that the voltage is attained, decode circuits 196, 198, . . . , 200 generating a control signal for determining if a voltage has been attained for each voltage setting in the erasing operation are necessary, resulting in necessity for a large area.

Figure 39:
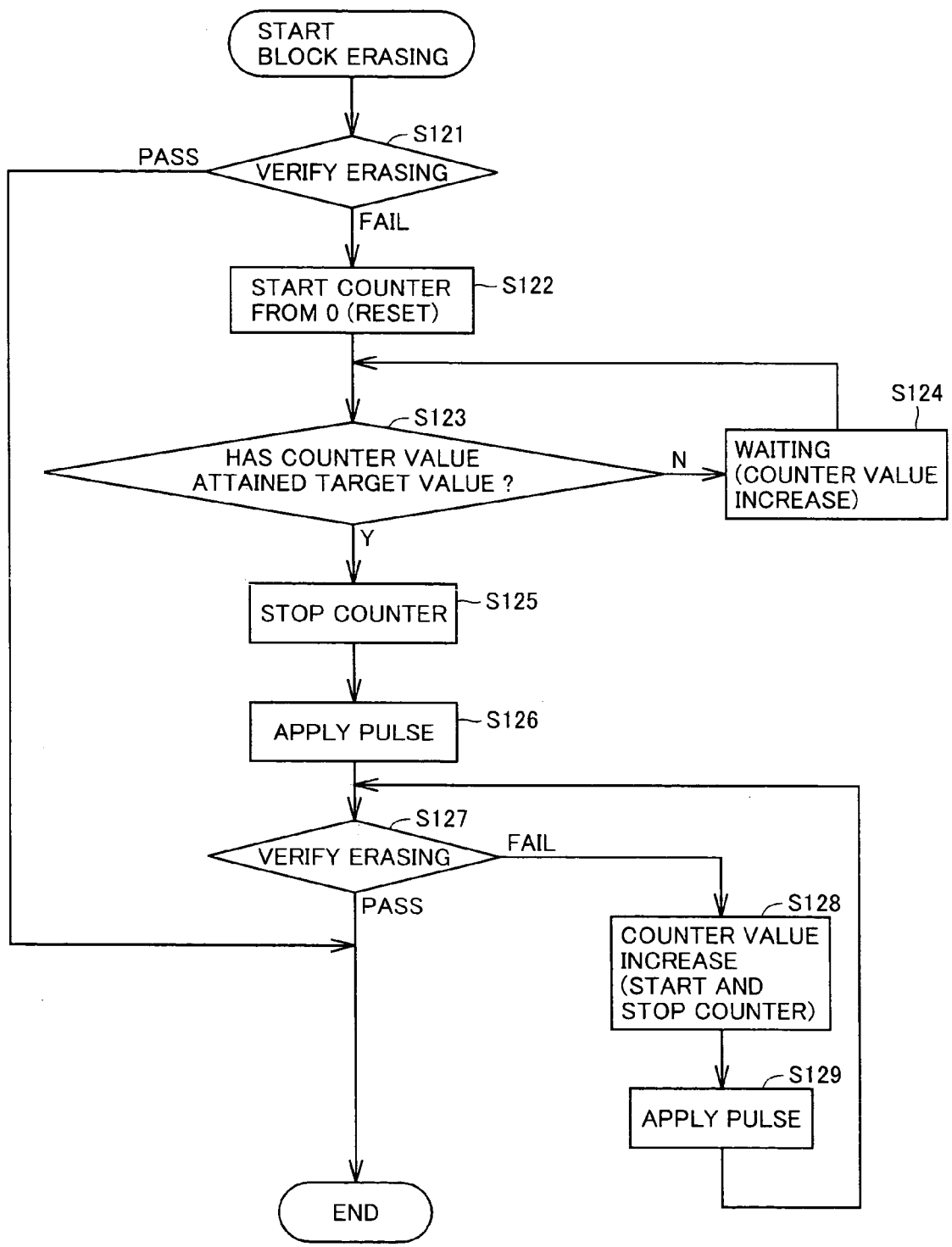
FIG. 39 is a flowchart illustrating a block erasing operation in the reference example shown in FIG. 38.

FIG. 39 is a flowchart illustrating a block erasing operation in the reference example shown in FIG. 38.

Referring to FIG. 39, when block erasing is started, erase verify is initially performed in step S121. If determination as pass is made as a result of erase verify in step S121, the block erasing operation ends.

If determination as failure is made as a result of erase verify in step S121, the process proceeds to step S122, and the CPU starts counting from "0" after the counter is reset. Then, in step S123, whether or not the count value has attained the target value is determined. If the counter has not attained the target value, the count value is increased in step S124, and whether or not the count value has attained the target value is determined again in step S123.

If it is determined that the count value has attained the target value in step S123, a counter stop signal is sent from power supply control circuit 10A to CPU 6A, and therefore, counter 210 stops the counting operation (step S125). In step S126, a pulse is applied for a prescribed time period, and in step S127, erase verify is performed.

If determination as failure is made as a result of erase verify in step S127, the count value is increased in step S128. In other words, counter 210 starts its operation in response to the enable signal from CPU 6A, and CPU 6A stops counter 210 in response to stop signal C-STOP sent from power supply control circuit 10A. Then, in step S129, a pulse is applied for a prescribed time period. After the pulse is applied in step S129, erase verify is again performed in step S127.

If determination as pass is made as a result of erase verify in step S127, the block erasing ends.

Figure 40:
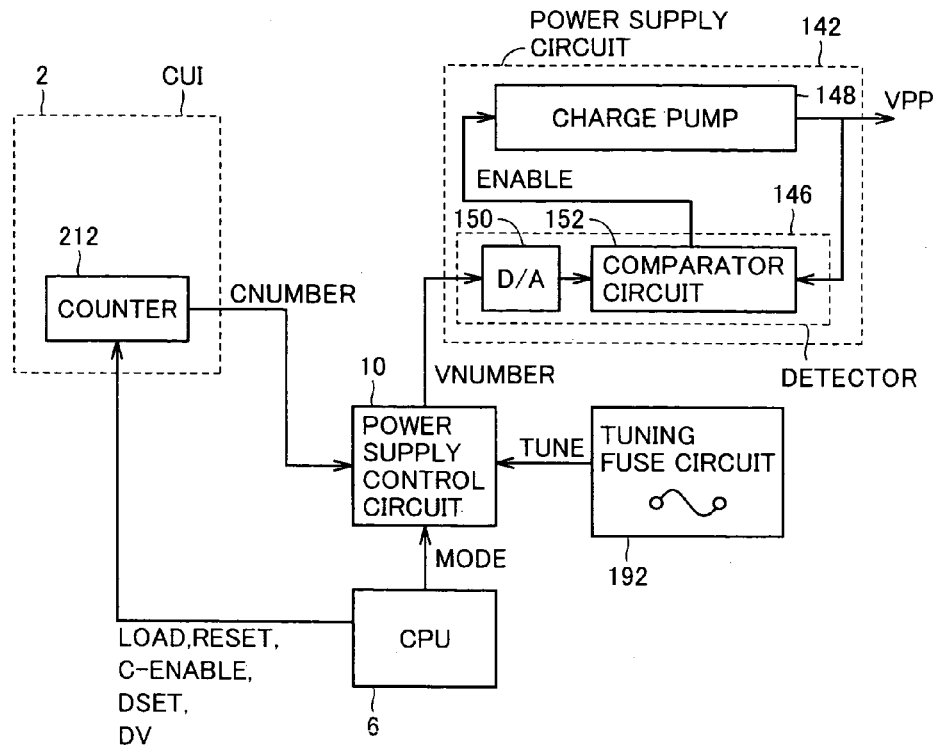
FIG. 40 is a block diagram illustrating a configuration associated with charge pump control in block erasing in Embodiment 6.

FIG. 40 is a block diagram illustrating a configuration associated with charge pump control in block erasing in Embodiment 6.

Referring to FIG. 40, a counter 212 included in command user interface portion 2 can set an initial value DSET in response to a signal LOAD sent from CPU 6. The count value of counter 212 is reset to "0" in response to reset signal RESET output by CPU 6. Counter 212 counts up when signal C-ENABLE is activated, and does not count up when it is inactivated. In addition, counter 212 can vary an amount of increase in the count value for one step in counting up in response to signal DV.

Figure 41:
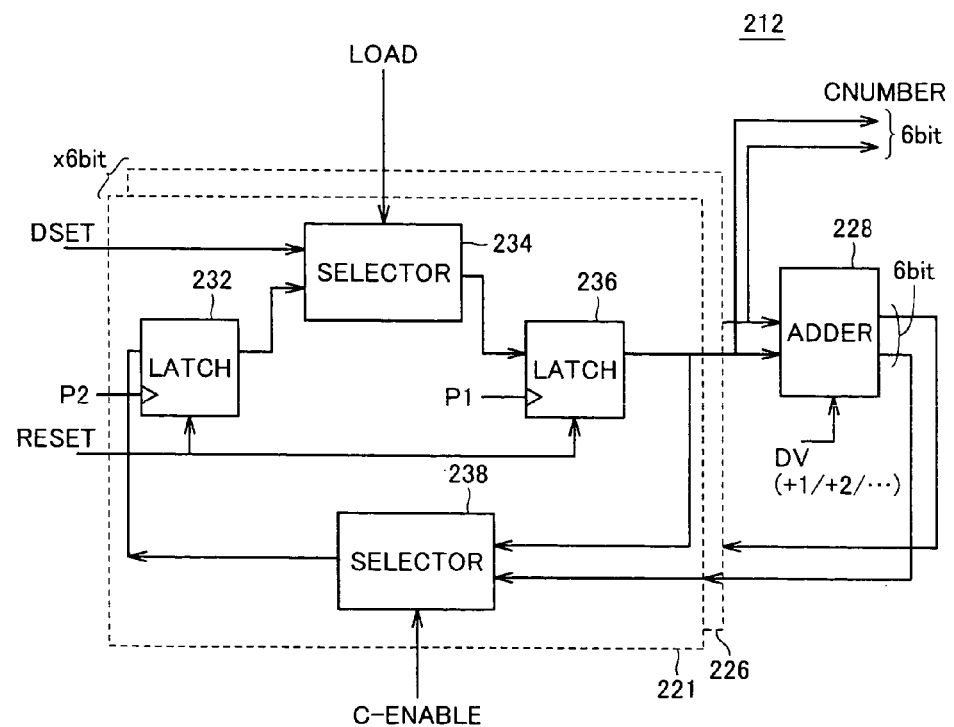
FIG. 41 is a block diagram showing a configuration of a counter 212 in FIG. 40.

FIG. 41 is a block diagram showing a configuration of counter 212 in FIG. 40.

Referring to FIG. 41, counter 212 includes holding circuits 221 to 226 covering 6 bits and an adder 228.

Holding circuit 221 includes a latch circuit 232 reset in response to reset signal RESET and taking in an input value in response to a clock signal P2, a selector 234 switching between an output from latch circuit 232 and initial setting value DSET in response to load signal LOAD for output, and a latch circuit 236 taking in an output from selector 234 in response to a clock signal P1. Latch circuit 236 is reset in response to reset signal RESET.

Holding circuit 221 further includes a selector 238 switching between an output from latch circuit 236 and a corresponding bit among 6-bit outputs from adder 228 in response to signal C-ENABLE. An output from selector 238 is provided to an input of latch circuit 232.

Adder 228 adds increment value DV to the 6-bit outputs from holding circuits 221 to 226 and outputs results of addition to holding circuits 221 to 226 respectively. When the increment value is set to +1, for example, counter 212 increases the count value by 1 for 1 clock. In addition, when the increment value is set to +2, counter 212 increases the count value by 2 for 1 clock. In this manner, the gradient of the ramp waveform can be varied.

Figure 42:
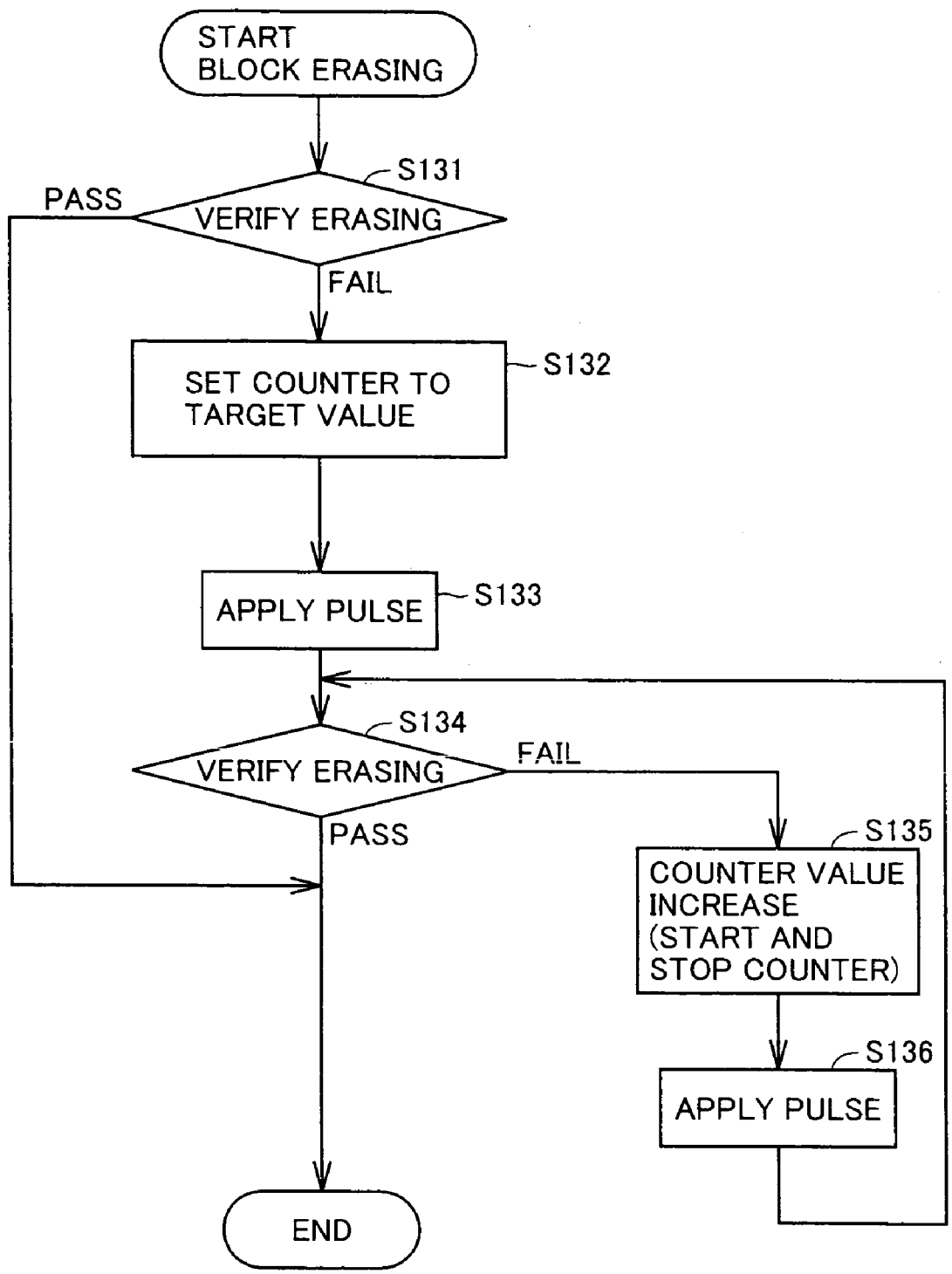
FIG. 42 is a flowchart illustrating a block erasing operation in Embodiment 6.

FIG. 42 is a flowchart illustrating a block erasing operation in Embodiment 6.

Referring to FIG. 42, when block erasing is instructed by the command, erase verify is initially performed in step S131. If determination as pass is made as a result of erase verify, block erasing ends.

On the other hand, if determination as failure is made as a result of erase verify, CPU 6 sets a target voltage value in counter 212 in step S132. In this manner, the voltage is raised with a rate in accordance with the current supply capability of the charge pump, and pulse application can be performed for a set-up time period reduced in step S133.

Then, erase verify is performed in step S134. If determination as failure is made as a result of erase verify, the voltage is raised by increasing the count value in step S135. Then, pulse application is performed in step S136, and erase verify is again performed in step S134. If determination as pass is made as a result of erase verify in step S134, block erasing is completed.

As described above, in Embodiment 6, modification such that the initial value can be set in the counter counting up the voltage value is made. Therefore, the voltage can quickly be applied with a rate in accordance with the capability of the charge pump in the power supply circuit. For example, when 8V is necessary as a voltage to be applied, the set-up time that has conventionally been 5.6 µs is reduced to 1.5 µs. In addition, though a plurality of decode circuits 196 to 200 have been necessary in FIG. 38, the initial value can directly be set in the counter in FIG. 40, whereby the circuit size can be made smaller and the layout area can be reduced.

Embodiment 7

In Embodiment 7, a writing operation to a spare memory cell in a flash memory will be described.

Conventionally, when a defect is found in a normal memory cell array, the defect has been replaced before a writing operation into a spare memory cell array is checked, and the writing and reading operation into/from the spare memory cell used for replacement has been checked later. In order to further improve product yield, however, it is more desirable to carry out replacement after an operation of a spare memory cell array portion is checked, that is, after it is confirmed that the spare memory cell array portion is not defective.

On the other hand, in a flash memory, it takes time particularly for a writing operation, and accordingly, the time for writing is further extended if conventional writing and reading into/from the normal cell array is performed together with a similar process for the spare memory cell array. Therefore, multi-writing, that is, simultaneous writing to the normal memory cell array as well as to the spare memory cell array is performed in order to reduce time for writing.

Figure 43:
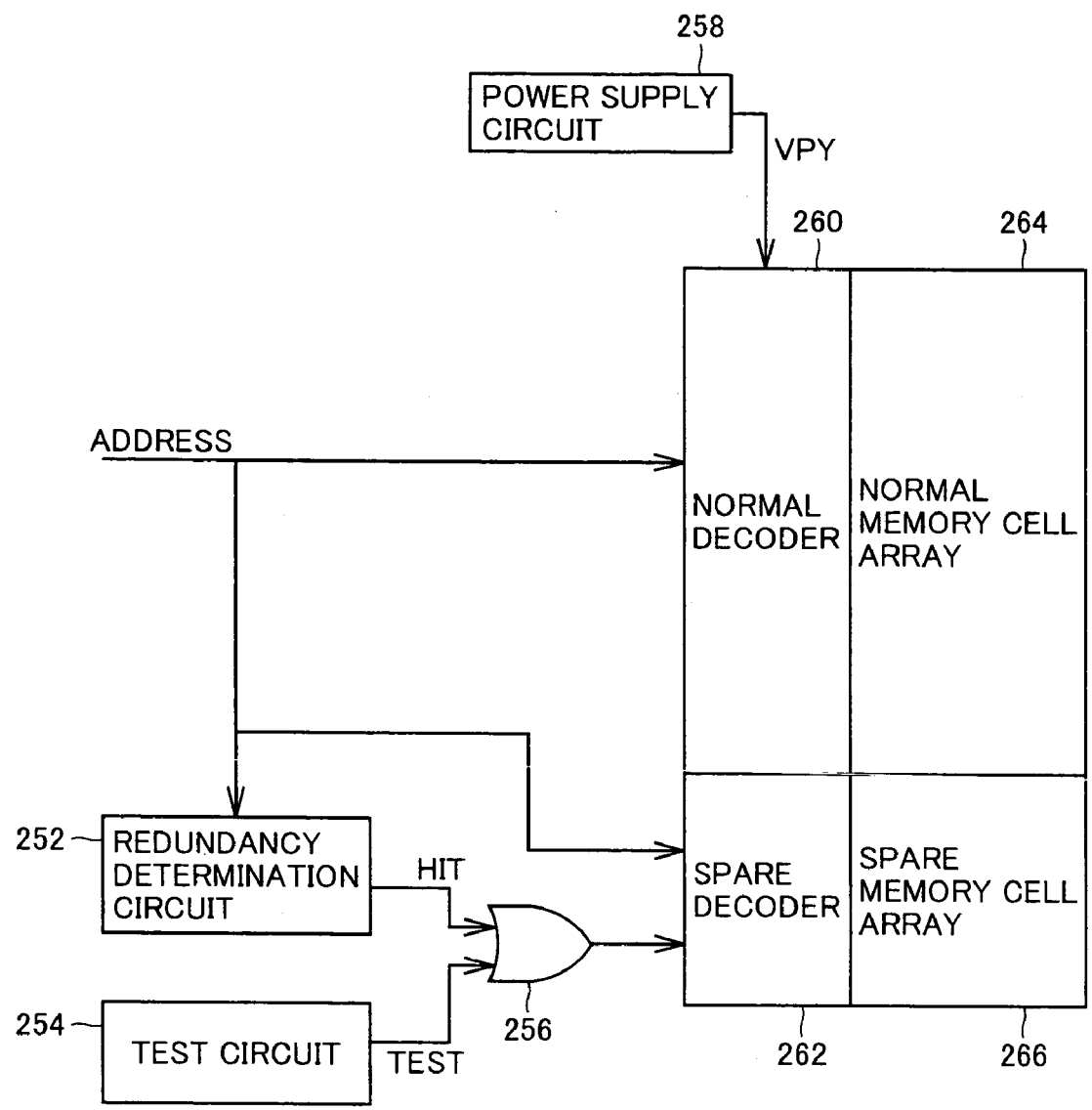
FIG. 43 is a block diagram illustrating a writing operation into a spare memory cell array.

FIG. 43 is a block diagram illustrating a writing operation into the spare memory cell array.

Referring to FIG. 43, an input address ADDRESS is provided to a normal decoder 260 and a redundancy determination circuit 252. If the address corresponds to a defective memory cell in the normal memory cell array, redundancy determination circuit 252 activates a signal HIT. Correspondingly, a spare decoder 262 selects a portion of a spare memory cell array 266.

Meanwhile, in order to check writing into spare memory cell array 266 in advance, a test signal TEST is activated in a TEST circuit 254 so as to cause TEST circuit 254 to perform a testing operation with respect to spare decoder 262. In a test operation, spare decoder 262 selects spare memory cell array 266 in response to address signal ADDRESS. Spare decoder 262 selects a portion of the spare memory cell array in response to address signal ADDRESS in the testing operation, in order to solve a problem of a probability of selection.

The problem of the probability of selection is as follows. As described later, the normal decoder selects a portion of the normal memory cell array with a probability of ⅟₃₂ in accordance with the address. On the other hand, if the hit signal alone is forcibly activated and the spare decoder makes one-to-one selection in the testing operation, the writing pulse is applied to the spare memory cell array with a frequency 32 times higher than that for the normal cell array. Accordingly, the spare memory cell array is susceptible to deterioration.

In addition, though a power supply circuit 258 supplies a high voltage VPY to normal decoder 260 and spare decoder 262, the current supply capability of power HIT is forcibly activated. For example, when 16 bits of the normal memory cell are simultaneously written in the normal operation in addition to simultaneous writing into 8-bit spare cells in the testing operation, capability of the charge pump in power supply circuit 258 should be 1.5 times larger. On the other hand, if only an extra 1 bit of the spare memory cell array is written simultaneously with writing to 16 bits, the capability of the charge pump does not need to be enhanced to a large extent.

Figure 44:
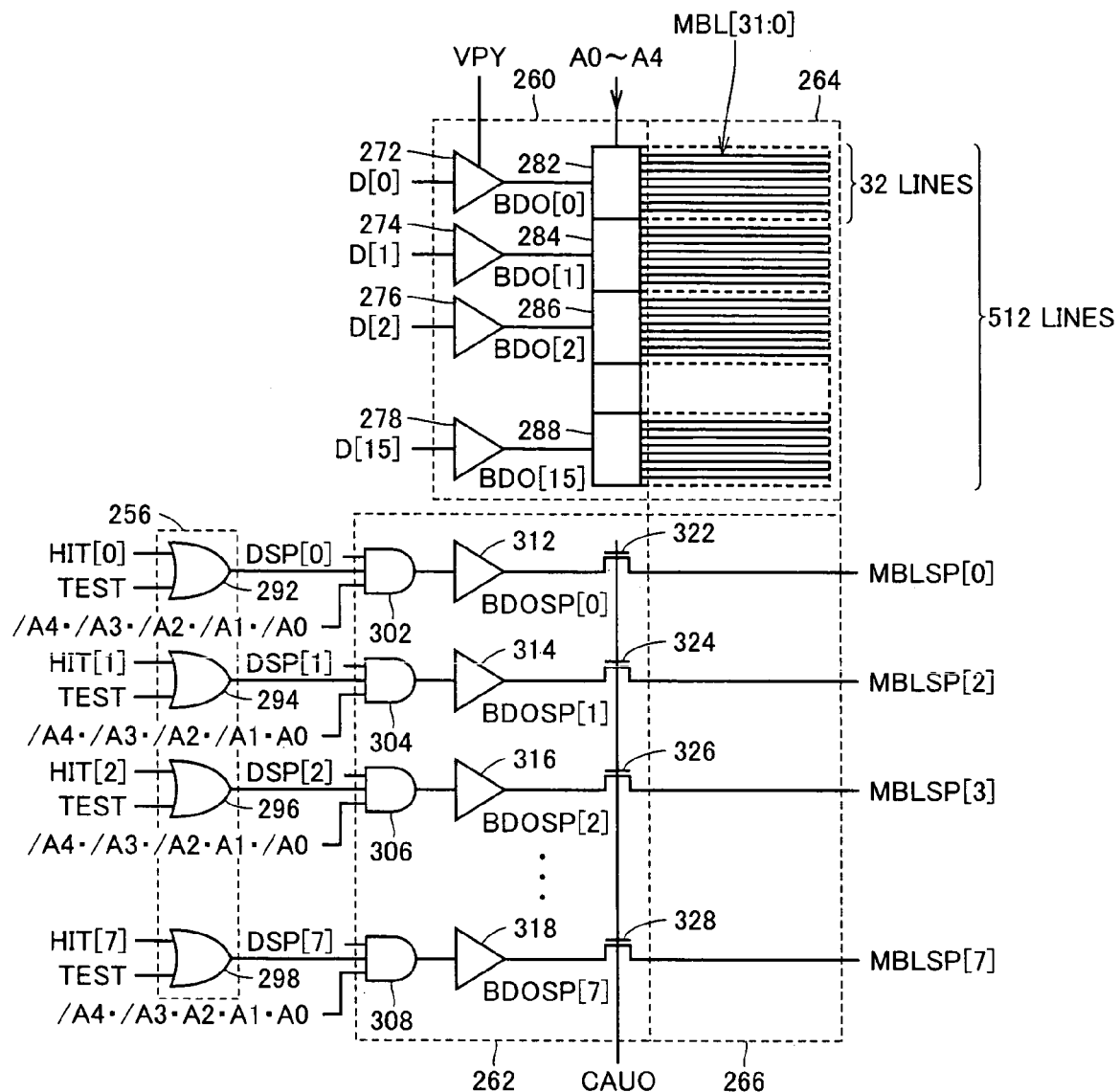
FIG. 44 is a circuit diagram illustrating a configuration of a normal decoder 260, a normal memory cell array 264, a spare decoder 262, and a spare memory cell array 266 in FIG. 43.

FIG. 44 is a circuit diagram for illustrating a configuration of normal decoder 260, a normal memory cell array 264, spare decoder 262, and spare memory cell array 266 in FIG. 43.

Referring to FIG. 44, normal decoder 260 includes a buffer circuit 272 driving an output signal BDO[0] to high voltage VPY in accordance with write data D[0], a buffer circuit 274 driving an output signal BDO[1] to high voltage VPY in accordance with write data D[1], a buffer circuit 276 driving an output signal BDO[2] to high voltage VPY in accordance with write data D[2], and a buffer circuit 278 driving an output signal BDO[15] to high voltage VPY in accordance with write data D[15].

Normal decoder 260 further includes a selector 282 selecting one of 32 main bit lines in accordance with address signals A0 to A4 and transmitting signal BDO[0], a selector 284 selecting one of 32 main bit lines in accordance with address signals A0 to A4 and transmitting signal BDO[1], a selector 286 selecting one of 32 main bit lines in accordance with address signals A0 to A4 and transmitting signal BDO[2], and a selector 288 selecting one of 32 main bit lines in accordance with address signals A0 to A4 and transmitting signal BDO[15].

Main bit lines MBL[31:0] corresponding to each selector 282, 284, 286, and 288 are provided in normal memory cell array 264, in which memory cell transistors are arranged in matrix.

OR circuit 256 includes an OR circuit 292 receiving signal HIT[0] and signal TEST, an OR circuit 294 receiving signal HIT[1] and signal TEST, an OR circuit 296 receiving signal HIT[2] and signal TEST, and an OR circuit 298 receiving signal HIT[7] and signal TEST.

Spare decoder 262 includes an AND circuit 302 receiving signal DSP[0], an output from OR circuit 292, and predecode signals/A4•/A3•/A2•/A1•/A0, an AND circuit 304 receiving signal DSP[1], an output from OR circuit 294, and predecode signals/A4•/A3•A2•/•A1•A0, an AND circuit 306 receiving signal DSP[2], an output from OR circuit 296, and predecode signals/A4•/A3•/A2•A1•/A0, and an AND circuit 308 receiving signal DSP[7], an output from OR circuit 298, and predecode signals /A4•/A3•A2•A1•A0.

Spare decoder 262 further includes buffer circuits 312, 314, 316, and 318 receiving inputs from AND circuits 302, 304, 306, and 308 respectively. Buffer circuits 312, 314, 316, and 318 receive high voltage VPY as a power supply voltage, and output signals BDOSP[0], BDOSP[1], BDOSP[2], and BDOSP[7] respectively.

Figure 45:
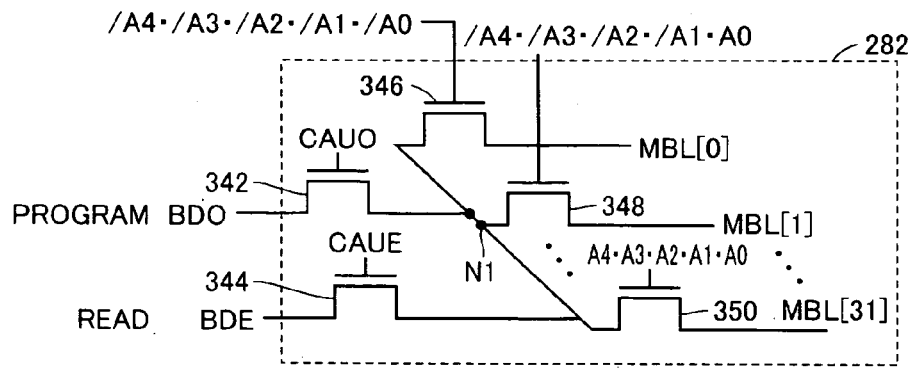
FIG. 45 is a circuit diagram showing a configuration of a selector 282 in FIG. 44.

Spare decoder 262 further includes N-channel MOS transistors 322, 324, 326, and 328 for transmitting signals BDOSP[0], BDOSP[1], BDOSP[2], and BDOSP[7] to spare bit lines MBLSP[0], MBLSP[1], MBLSP[2], and MBLSP[7] upon receiving a signal CAU0 at the gates, respectively FIG. 45 is a circuit diagram showing a configuration of selector 282 in FIG. 44.

Referring to FIG. 45, selector 282 includes an N-channel MOS transistor 342 transmitting signal BDO activated in programming to a node N1 when signal CAU0 is activated, and an N-channel MOS transistor 344 provided in order to output a signal from node N1 as a signal BDE during reading, and receiving a signal CAUE at its gate.

Selector 282 further includes an N-channel MOS transistor 346 connected between node N1 and bit line MBL[0] and receiving predecode signals /A4•/A3•/A2•/A1•/A0 at the gate, an N-channel MOS transistor 348 connected between node N1 and main bit line MBL[1] and receiving predecode signals/A4•/A3•/A2•/•A1•A0 at the gate, and an N-channel MOS transistor 350 connected between node N1 and bit line MBL[31] and receiving predecode signals A4•A3•A2•A1•A0 at the gate.

Referring again to FIG. 44, selectors 282 to 288 select bit line MBL with a probability of 1/32. In order to carry out control regardless of a spare determination signal HIT in multi-writing, test signal TEST is activated to H level. When a high voltage is applied to spare bit lines MBLSP[0] to MBLSP[7], the probability of selection is forcibly set to 1/32 using address signals A4 to A0.

When a signal A[4:0] is set to "00000" in FIG. 44, bit line MBLSP[0] is selected. Meanwhile, when signal A[4:0] is set to "00001", bit line MBLSP[1] is selected, and a high voltage is applied during programming.

Figure 46:
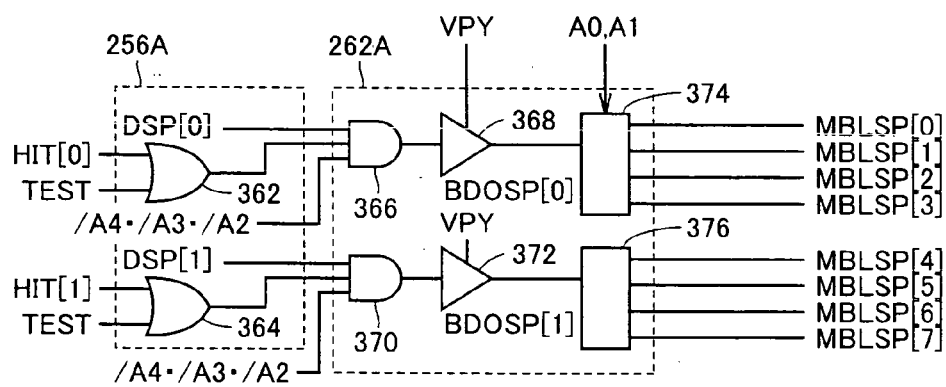
FIG. 46 shows a variation for spare selection in the configuration shown in FIG. 44.

FIG. 46 shows a variation for spare selection in the configuration shown in FIG. 44.

Referring to FIG. 46, an OR circuit 256A includes an OR circuit 362 receiving signal HIT[0] and signal TEST, and an OR circuit 364 receiving signal HIT[1] and signal TEST.

A spare decoder 262A includes an AND circuit 366 receiving data signal DSP[0], an output from OR circuit 362, and predecode signals/A4•/A3•/A2, an AND circuit 370 receiving data signal DSP[1], an output from OR circuit 364, and predecode signals/A4•/A3•A2, a buffer circuit 368 receiving high voltage VPY as a power supply voltage, receiving an output from AND circuit 366 at its input, and outputting signal BDOSP[0], a buffer circuit 372 receiving high voltage VPY as a power supply voltage, receiving an output from AND circuit 370 at its input, and outputting signal BDOSP[1], a ¼ selection circuit 374 selecting one of bit lines MBLSP[0] to MBLSP[3] in accordance with address signals A0 and A1 and providing signal BDOSP[0] to the selected bit line, and a ¼ selection circuit 376 selecting one of bit lines MBLSP[4] to MBLSP[7] in accordance with address signals A0 and A1 and providing signal BDOSP[1] to the selected bit line.

Figure 47:
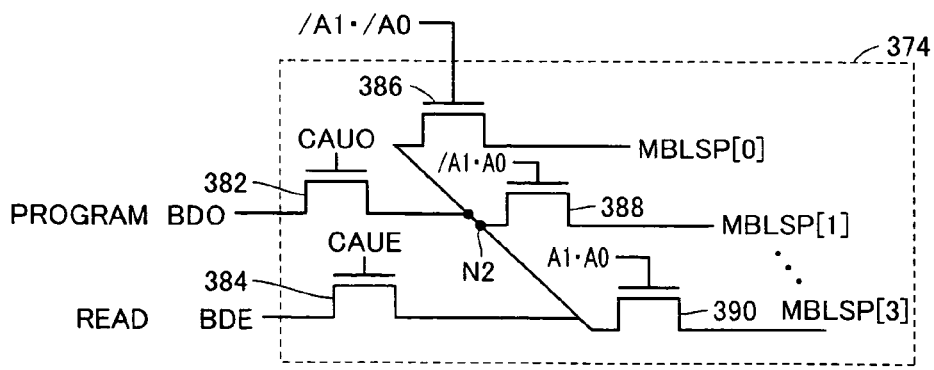
FIG. 47 is a circuit diagram showing a configuration of a ¼ selection circuit 374 in FIG. 46.

FIG. 47 is a circuit diagram showing a configuration of a ¼ selection circuit 374 in FIG. 46.

Referring to FIG. 47, ¼ selection circuit 374 includes an N-channel MOS transistor 382 transmitting signal BDO activated in programming to a node N2 when signal CAU0 is activated, and an N-channel MOS transistor 384 provided in order to output a signal from node N2 as signal BDE in reading, and receiving signal CAUE at its gate.

In addition, ¼ selection circuit 374 includes an N-channel MOS transistor 386 connected between node N2 and bit line MBLSP[0] and receiving predecode signals /A1•/A0 at its gate, an N-channel MOS transistor 388 connected between node N2 and main bit line MBLSP[1] and receiving predecode signals/A1•A0 at its gate, and an N-channel MOS transistor 390 provided between node N1 and bit line MBLSP[3] and receiving predecode signals A1•A0 at its gate.

In the variation shown in FIGS. 46 and 47, not only a high-voltage signal of signal BDO[7:0] is decoded, but also ¼ selection is performed using address A[1:0] on the column decoder side and ⅛ selection is performed in AND circuits 366, 370 using address A[4:2]. Thus, an effect as in FIG. 44 can be obtained.

In Embodiment 7, a non-volatile semiconductor memory device attaining improved reliability of the spare memory cell and capable of simultaneous writing to the normal memory cell and the spare memory cell without significant enhancement of the capability of the power supply circuit can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:
 a memory block including a plurality of memory cells storing data in a non-volatile manner;
 a power supply circuit generating a voltage to be applied to said plurality of memory cells; and
 a control portion controlling said power supply circuit so as to apply an erasing pulse collectively to said plurality of memory cells in said memory block wherein
 in repeated application of said erasing pulse, said control portion increases a voltage of said erasing pulse of a first fixed pulse width in accordance with number of times of application until the voltage of said erasing pulse attains a maximum application voltage value, and when the voltage of said erasing pulse attains said maximum application voltage value, said control portion increases the pulse width of said erasing pulse in accordance with said number of times of application.

2. The non-volatile semiconductor memory device according to claim 1, wherein
said control portion causes application of said erasing pulse of a second fixed pulse width until said number of times of application attains a prescribed value, and when said number of times of application attains said prescribed value, said control portion causes application of said erasing pulse of said first pulse width.

3. The non-volatile semiconductor memory device according to claim 1, wherein
when the voltage of said erasing pulse attains said maximum application voltage value, said control portion increases the pulse width after said erasing pulse of a same pulse width is applied prescribed times.

4. The non-volatile semiconductor memory device according to claim 1, wherein
said control portion reads said maximum application voltage value, said first fixed pulse width, an increment of the voltage of said erasing pulse, and an increment of said pulse width as a variable.

5. A non-volatile semiconductor memory device, comprising:
a memory block including a plurality of memory cells storing data in a non-volatile manner;
a power supply circuit generating a voltage to be applied to said plurality of memory cells;
a decode circuit decoding an address signal in order to select a portion of said plurality of memory cells, said decode circuit performing a first operation to select said portion in accordance with said address signal and a second operation to select another region in addition to said portion in accordance with said address signal, by switching between said two operations in accordance with a control signal; and
a control portion controlling said power supply circuit and said decode circuit so as to erase contents in said memory block wherein
said control portion causes said decode circuit to perform said second operation by said control signal after said memory block enters a first erased state, in order to apply an overerase recovery pulse to said memory block.

6. The non-volatile semiconductor memory device according to claim 5, wherein
said control portion continuously applies said overerase recovery pulse in a number corresponding to a target time period, and thereafter performs overerase verify.

7. A non-volatile semiconductor memory device, comprising:
a memory block including a plurality of memory transistors storing data in a non-volatile manner;
a power supply circuit generating a gate voltage to be applied to a control gate of said plurality of transistors and a drain voltage to be applied to a drain thereof;
a counter counting up a count value corresponding to a target voltage value of said gate voltage in response to a clock signal; and
a control portion controlling said power supply circuit wherein
said control portion instructs activation of said drain voltage to said power supply circuit, and thereafter sets an initial value for said count value in said counter, so as to control start and stop of a count-up operation of said counter;
said counter has a count-up rate variable in accordance with an instruction signal from said control portion,
said memory block further includes a pair of memory transistors storing a lock bit indicating whether or not said memory block is in a write permission state, and
if a writing target is said lock bit, said control portion outputs said instruction signal so that said count-up rate becomes slower than in a case where the writing target is other than said lock bit, and applies a writing pulse so that a pulse width for one application is made longer than in a case where said writing target is other than said lock bit.

8. The non-volatile semiconductor memory device according to claim 7, wherein if said writing target is said lock bit, said control portion sets an initial value of said count value in said counter every time a writing pulse is applied, so as to start a count-up operation of said counter, and if said writing target is other than said lock bit, said control portion applies a square wave as a writing pulse for a second time and later.

9. A non-volatile semiconductor memory device, comprising:
a memory block including a plurality of memory transistors storing data in a non-volatile manner;
a power supply circuit generating a voltage to be applied to said plurality of memory transistors;
a counter counting up a count value corresponding to a target voltage value of said voltage in response to a clock signal; and
a control portion controlling said power supply circuit wherein
when collective erasing of contents in said memory block is instructed, said control portion sets an initial value for said count value in said counter so as to control start and stop of a count-up operation of said counter,
said counter includes
an adder adding a value given from said control portion to an input value of a plurality of bits, and
a holding circuit having a hold value set in response to a load signal, taking in an output from said adder in response to activation of an enable signal, maintaining a current hold value in response to inactivation of the enable signal, and outputting the hold value to said adder as the input value of said plurality of bits.

* * * * *